United States Patent
Huang et al.

(10) Patent No.: US 11,977,205 B2
(45) Date of Patent: May 7, 2024

(54) CURVED SURFACE FILMS AND METHODS OF MANUFACTURING THE SAME

(71) Applicant: CORNING INCORPORATED, Corning, NY (US)

(72) Inventors: Ming-Huang Huang, Ithaca, NY (US); Chang-gyu Kim, Suwon-si (KR); Hoon Kim, Horseheads, NY (US); Soo Ho Park, Cheonan-si (KR); Jue Wang, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/711,303

(22) Filed: Apr. 1, 2022

(65) Prior Publication Data

US 2022/0221617 A1 Jul. 14, 2022

Related U.S. Application Data

(62) Division of application No. 16/401,703, filed on May 2, 2019, now Pat. No. 11,320,568.

(Continued)

(51) Int. Cl.
*G02B 1/02* (2006.01)
*C23C 16/40* (2006.01)
(Continued)

(52) U.S. Cl.
CPC ............. *G02B 1/02* (2013.01); *C23C 16/403* (2013.01); *C23C 16/45553* (2013.01); *G02B 3/00* (2013.01)

(58) Field of Classification Search
CPC .. G02B 1/10; G02B 1/11; G02B 1/115; G02B 1/116; G02B 1/113; G02B 1/118;
(Continued)

(56) References Cited

U.S. PATENT DOCUMENTS 5,993,898 A 11/1999 Nagatsuka
6,574,039 B1 6/2003 Murata et al.
(Continued)

FOREIGN PATENT DOCUMENTS

CN 102703880 A 10/2012
CN 101409301 B 6/2013
(Continued)

OTHER PUBLICATIONS

Japanese Patent Application No. 2020-563526, Office Action dated Feb. 28, 2023, 7 pages (English Translation only), Japanese Patent Office.

(Continued)

*Primary Examiner* — Jie Lei
(74) *Attorney, Agent, or Firm* — Kevin L. Bray

(57) ABSTRACT

An optical element including an optically transparent lens which defines a curved surface having a steepness given by an R/# of from about 0.5 to about 1.0. A film is positioned on the curved surface. The film includes an index layer. A composite layer is positioned on the curved surface having a refractive index greater than the index layer. The composite layer includes $HfO_2$ and $Al_2O_3$. The composite layer has a mole fraction X of $HfO_2$, wherein X is from about 0.05 to about 0.95 and a mole fraction of $Al_2O_3$ in the composite layer is 1-X.

16 Claims, 13 Drawing Sheets

Related U.S. Application Data

(60) Provisional application No. 62/670,187, filed on May 11, 2018.

(51) Int. Cl.
*C23C 16/455* (2006.01)
*G02B 3/00* (2006.01)

(58) Field of Classification Search
CPC .. G02B 1/111; G02B 1/02; G02B 3/00; G02B 17/02; G02B 5/20; G02B 5/28; C23C 16/403; C23C 16/40; C23C 16/455; C23C 16/45553
USPC ........ 359/642, 586, 589, 584, 359; 428/215, 428/336, 328, 354; 427/162, 167, 164
See application file for complete search history.

(56) References Cited

U.S. PATENT DOCUMENTS

| | | | |
|---|---|---|---|
| 7,393,736 | B2 | 7/2008 | Ahn et al. |
| 7,901,736 | B2 | 3/2011 | Maula et al. |
| 8,169,705 | B2 | 5/2012 | Cangemi et al. |
| 8,361,544 | B2 | 1/2013 | Fedorovskaya et al. |
| 9,123,622 | B2 | 9/2015 | Hoenk et al. |
| 9,904,002 | B2 | 2/2018 | Duerksen et al. |
| 9,954,021 | B2 | 4/2018 | Yamaguchi et al. |
| 11,320,568 | B2 * | 5/2022 | Huang .................. G02B 1/02 |
| 2005/0275944 | A1 | 12/2005 | Wang et al. |
| 2009/0207495 | A1 | 8/2009 | Yamaguchi et al. |
| 2009/0244709 | A1 | 10/2009 | Suzuki et al. |
| 2012/0308739 | A1 | 12/2012 | Lansalot-Matras et al. |
| 2015/0097165 | A1 | 4/2015 | Setz et al. |
| 2016/0195656 | A1 | 7/2016 | Chiu et al. |
| 2016/0358749 | A1 | 12/2016 | Sant |
| 2016/0376705 | A1 | 12/2016 | Phillips et al. |

FOREIGN PATENT DOCUMENTS

| | | |
|---|---|---|
| JP | 07-244204 A | 9/1995 |
| JP | 10-319209 A | 12/1998 |
| JP | 2004-176081 A | 6/2004 |
| JP | 2005-173029 A | 6/2005 |
| JP | 2005-195625 A | 7/2005 |
| JP | 2009-156954 A | 7/2009 |
| JP | 2009-258711 A | 11/2009 |
| JP | 2011-084760 A | 4/2011 |
| JP | 2012-119046 A | 6/2012 |
| JP | 5906507 B1 | 4/2016 |
| KR | 10-2016-0143532 A | 12/2016 |
| WO | 01/23914 A1 | 4/2001 |
| WO | 2013/169266 A1 | 11/2013 |

OTHER PUBLICATIONS

Amusan et al; "Ag Films Grown by Remote Plasma Enhanced Atomic Layer Deposition on Different Substrates," J. Vac. Sci. Technol. A 34(1), 01A126(2016).

Franke C et al: "Estimation of the composition of coelectron-beam-evaporated thin-mixture films by making use of t he Wiener bounds", Applied Optics, Optical Society of America, vol. 54, No. 9, Mar. 20, 2015, pp. 2362-2370.

Hennessy et al; "Atomic Layer Deposition of Magnesium Fluoride Via Bis(Ethylcyclopentadienyl)Magnesium and Anhydrous Hydrogen Fluoride;" J. Vac. Sci. Technol. A 33(1), 01A125(2015).

Hennessy et al; "Ultraviolet Optical Properties of Aluminum Fluoride Thin Films Deposited by Atomic Layer Deposition," J. Vac. Sci. Technol. A 34, 01A120 (2016).

International Preliminary Report on Patentability of the International Searching Authority; PCT/US2019/031717; dated Nov. 26, 2020; 8 pages; European Patent Office.

International Search Report and Written Opinion of the International Searching Authority, PCT/US2019/031717; dated Aug. 12, 2019; 12 pages; European Patent Office.

Lee et al; "Characterization of Ultra-Thin Hf02 Gate Oxide Prepared by Using Atomic Layer Deposition" ; J. Kor. Phy Soc. V 42 No. 2 2003, 272.

Lee et al; "Study on the Characteristics of Aluminum Thin Films Prepared by Atomic Layer Dpeosition," J. Vac. Sci. Technol. A 20(6), 1986(2002).

M. Bonvalot et al: Combined spectroscopic ellipsometry and attenuated t otal refle ct ion analyses of Al2O3/HfO2 nanolaminates 11 , Thin Solid Films, vol. 518, No. 18, Jul. 1, 2010, pp. 5057-5060.

Marszalek et al., "0ptical properties of the Al2O3/SiO2 and Al2O3/HfO2/SiO2 anti reflective coatings", Al2O3/HfO2/SiO2 anti reflective coatings 11 , Materials Science-Poland, Jan. 1, 2014, pp. 80-87.

Olaf Stenzel et al: "Mixed oxide coatings for optics". Applied Optics, Optical Society of America, vol. 50, No. 9, Mar. 20, 2011,.

Pfeiffer et al; "Atomic Layer Deposition for Antireflection Coatings Using SiO2 As Low-Refractive Index Material," Proc of SPIE vol. 9627; 96270Q-1-96270Q-7 (2015).

Pfeiffer, Kristin et al., "Antireflection Coatings for Strongly Curved Glass Lenses by Atomic Layer Deposition," Coatings 7(8), 118, Aug. 9, 2017, https://doi.org/10.3390/coatings7080118.

Pfeiffer, Kristin et al., "Comparative study of ALD SiO2 thin films for optical applications," Optical Materials Express, vol. 6, pp. 660-670, Jan. 27, 2016, https://doi.or/10.1364/OME.6.000660.

Poodt et al; "Spatial Atomic Layer Deposition: a Route Towards Further Industrialization of Atomic Layer Deposition," J. Vac. Sci. Technol. A 30(1), 010802-1(2012).

Profijt et al; "Plasma-Assisted Atomic Layer Deposition: Basics, Opportunities, and Challenges," J. Vac. Sci. Technol. A 29(5), 050801(2011).

Wang et al; "Optical Coatings With Ultralow Refractive Index SiO2 Films," SPIE 7504, 75040F (2009).

* cited by examiner

CURVED SURFACE FILMS AND METHODS OF MANUFACTURING THE SAME

This application is a divisional and claims the benefit of priority of U.S. patent application Ser. No. 16/401,703, filed May 2, 2019, which claims the benefit of priority to U.S. Provisional Application Ser. No. 62/670,187 filed on May 11, 2018, the content of which is relied upon and incorporated herein by reference in its entirety.

FIELD OF THE DISCLOSURE

The present disclosure generally relates to optical elements, and more specifically, to curved optical elements including films.

BACKGROUND

High numerical aperture (NA) lenses for optical systems may require many elements, some of which can have very steep surface curvatures. Steep surfaces create challenges for high-performance coatings over a wide angle range and/or a broad spectral bandwidth as the application of the films to curved surfaces may produce non-uniform thickness films and the like. Conventional films on lenses may be produced via physical vapor deposition (PVD) which is a line-of-sight deposition process. As coating material from the PVD process arrives at very large angles relative to the lens surface, the coating may exhibit thickness and mechanical properties which may be substantially different towards the edge compared to the center of the lens surface. The low coating uniformity leads to high spectral reflectance and polarization split at the edge of the lens. Several technical approaches have been explored to address the issue, such as tilting and masking. Both tilting and masking approaches can improve some coating uniformity on steep surfaces, but reduces coating packing density towards the center, leading to an increase scatter loss at the center. Accordingly, new optical films and methods of making them may be advantageous.

SUMMARY OF THE DISCLOSURE

According to at least one feature of the present disclosure, an optical element including an optically transparent lens which defines a curved surface having a steepness given by an R/# of from about 0.5 to about 1.0. A film is positioned on the curved surface. The film includes an index layer. A composite layer is positioned on the curved surface having a refractive index greater than the index layer. The composite layer includes $HfO_2$ and $Al_2O_3$. The composite layer has a mole fraction X of $HfO_2$, wherein X is from about 0.05 to about 0.95 and a mole fraction of $Al_2O_3$ in the composite layer is 1−X.

According to another feature of the present disclosure, an optical element includes a lens defining a curved surface. A film is positioned on the curved surface. The film includes a laminate layer positioned on the curved surface. The laminate layer having a plurality of first layers including $HfO_2$ and a plurality of second layers includes $Al_2O_3$. An index layer includes $SiO_2$. The film has a variation in reflectance of from about 0% to about 4% over a wavelength band of from about 220 nm to about 500 nm as measured across the lens and between about a 0 clear aperture value and a 0.96 clear aperture value as measured by reflective spectral microscopy.

According to another feature of the present disclosure, a method of forming a film of an optical element, comprises the steps of: positioning a substantially transparent lens in a reactor chamber, wherein the lens defines a curved surface; exposing the lens to a first precursor comprising at least one of Al and Hf such that the first precursor is deposited on the curved surface of the lens; exposing the first precursor on the curved surface to a first oxidizer such that the first precursor present on the curved surface of the lens reacts with the first oxidizer to form a high refractive index layer of the film; exposing the high refractive index layer to a second precursor such that the second precursor is deposited on the high refractive index layer; and exposing the second precursor on the high refractive index layer to a second oxidizer such that the second precursor present on the high refractive index layer reacts with the second oxidizer to form a low refractive index layer of the film.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Figure 1:
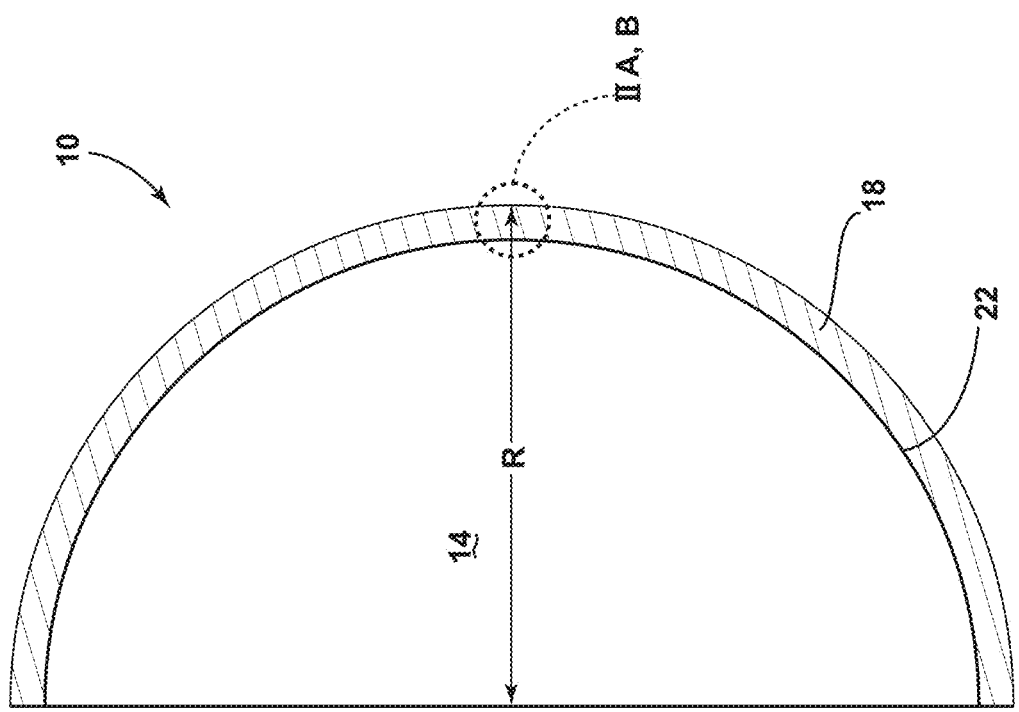
FIG. 1 is a schematic view of an optical element, according to at least one example.

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

Referring now to FIG. 1, an optical element 10 includes a lens 14 and a film 18. As will be explained in detail below, the film 18 may be a multilayered structure which may provide one or more properties to the lens 14 such as mechanical properties (e.g., scratch resistance) and/or optical properties (e.g., anti-reflection and color neutrality).

The lens 14 may include a glass, a glass-ceramic, a ceramic material and/or combinations thereof. Exemplary glass-based examples of the lens 14 may include soda lime glass, alkali aluminosilicate glass, alkali containing borosilicate glass and/or alkali aluminoborosilicate glass. For purposes of this disclosure, the term "glass-based" may mean a glass, a glass-ceramic and/or a ceramic material. According to various examples, the lens 14 may be a glass-based substrate. In glass-based examples of the lens 14, the lens 14 may be strengthened (e.g., alkali exchanged) or strong (e.g., polished to remove defects). The lens 14 may be substantially clear, transparent and/or free from light scattering. For example, the lens 14 may have a transmittance of from about 50% to about 100% at one or more wavelengths or wavelength bands over a wavelength range of from about 180 nm to about 700 nm. In glass-based examples of the lens 14, the lens 14 may have a refractive index in the range from about 1.45 to about 1.55 at a wavelength of about 266 nm. Further, the lens 14 of the optical element 10 may include sapphire and/or polymeric materials. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

The lens 14 may define one or more curved surfaces 22. The curved surfaces 22 aid in defining the lens 14 to have a generally curved shape. The curved surfaces 22 may form the lens 14 to have a generally biconvex, plano-convex, positive meniscus, negative meniscus, plano-concave, biconcave and/or combinations thereof. The curved surface 22 may have a steepness, or "speed," which is expressed as an R/# value. The R/# value may be calculated as a radius of curvature (R) divided by the clear aperture of the lens 14. For purposes of this disclosure, the radius of curvature may be defined as the distance between a vertex of the lens 14 and the center of curvature. For purposes of this disclosure, the clear aperture is defined as the diameter or size of the lens 14 through which light may pass. Clear aperture may be expressed herein as a fraction or decimal which indicates the distance from the center (e.g., 0.0 ca) of the clear aperture to the edge (1.0 ca) of the clear aperture. For example, halfway between the center of the clear aperture and the edge of the clear aperture is 0.5 ca.

The R/# of the curved surface 22 may be from about 0.5 to about 1.0, or from about 0.6 to about 1.0, or from about 0.7 to about 1.0, or from about 0.8 to about 1.0, or from about 0.9 to about 1.0. For example, the R/# value may be about 0.5, about 0.55, about 0.6, about 0.65, about 0.7, about 0.75, about 0.8, about 0.85, about 0.9, about 0.95, about 0.99, or any and all values and ranges therebetween. According to various examples, the curved surface 22 may have an R/# value of about 0.5 or greater. It will be understood that it is contemplated that one or more of the curved surfaces 22 of the lens 14 may have an R/# value of greater than 1 (e.g., 2 or greater, 5 or greater, 10 or greater, or 100 or greater) without departing from the teachings provided herein.

Still referring to FIG. 1, the film 18 is depicted as positioned directly on the curved surface 22 of the lens 14, but it will be understood that one or more layers, coatings and/or films may be positioned between the film 18 and the lens 14. For example, a crack mitigation layer, an adhesion layer, an electrically conductive layer, an electrically insulating layer, an optical layer, an anti-reflection layer, a protective layer, a scratch-resistant layer, a high hardness layer, other types of layers and/or combinations thereof may be positioned between the film 18 and the lens 14. Further, the film 18 may be positioned on more than one surface of the lens 14. For example, the film 18 may be positioned across multiple curved surfaces 22 and/or extend onto flat surfaces of the lens 14 without departing from the teachings provided herein.

The term "film," as applied to the film 18 and/or other films incorporated into the optical element 10, includes one or more layers that are formed by any known method in the art, including discrete deposition or continuous deposition processes. Such layers may be in direct contact with one another. The layers may be formed from the same material or more than one different material. In one or more alternative examples, such layers may have intervening layers of different materials disposed therebetween. In one or more examples, the film 18 may include one or more contiguous and uninterrupted layers and/or one or more discontinuous and interrupted layers (i.e., layers having different materials formed adjacent to one another).

The film 18 may be formed using various deposition methods such as vacuum deposition techniques, for example, chemical vapor deposition (e.g., plasma-enhanced chemical vapor deposition, low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. One or more layers of the optical film 18 may include nano-pores or mixed-materials to provide specific refractive index ranges or values.

The thickness of the film 18 may be in the range from about 0.005 µm to about 0.5 µm, or from about 0.01 µm to about 20 µm. According to other examples, the film 18 may have a thickness in the range from about 0.01 µm to about 10 µm, from about 0.05 µm to about 0.5 µm, from about 0.01 µm to about 0.15 µm or from about 0.015 µm to about 0.2 µm. In yet other examples, the film 18 may have a thickness from about 100 nm to about 200 nm. It will be understood that any and all values and ranges between above-noted values are contemplated.

According to various examples, the thickness of the film 18, or any layers thereof as described in greater detail below, may have a high uniformity. For example, the thickness of the film 18 and/or any layers thereof may have a variance in thickness of from about ±0 nm to about ±100 nm as measured between any two points along the film 18 and/or layer. For example, the film 18 and/or any layers thereof may have a variance in thickness of about ±100 nm or less, about ±90 nm or less, about ±80 nm or less, about ±70 nm or less, about ±60 nm or less, about ±50 nm or less, about ±40 nm or less, about ±30 nm or less, about ±20 nm or less, about AO nm or less, about ±9 nm or less, about ±8 nm or less, about ±7 nm or less, about ±6 nm or less, about ±5 nm or less, about ±4 nm or less, about ±3 nm or less, about ±2 nm or less, about ±1 nm or less, about ±0.5 nm or less, about ±0.1 nm or less or any and all values and ranges therebetween. As will be explained in greater detail below, the high uniformity of the film 18 may be advantageous in ensuring consistent optical properties of the optical element 10 across various clear aperture locations.

According to various examples, the film 18 may have a low carbon content. For example, the film 18 may have a volume, mass and/or mole percent of carbon of from about 0.01% to about 0.5%, or from about 0.02% to about 0.4%, or from about 0.03% to about 0.3%, or from about 0.04% to about 0.2%, or from about 0.05% to about 0.5%. For example, the carbon content of the film 18 may be about 0.5% or less, about 0.45% or less, about 0.4% or less, about 0.35% or less, about 0.3% or less, about 0.25% or less, about 0.2% or less, about 0.15% or less, about 0.1% or less, about 0.09% or less, about 0.08% or less, about 0.07% or less, about 0.06% or less, about 0.05% or less, about 0.04% or less, about 0.03% or less, about 0.02% or less, about 0.01% or less or any and all values and ranges therebetween.

Figure 2A:
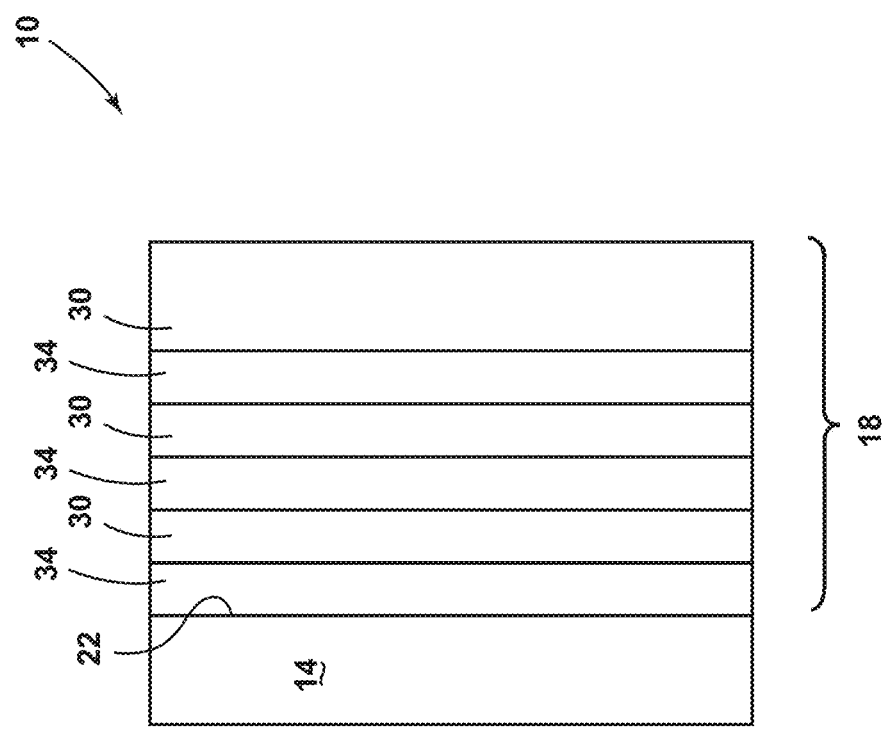
FIG. 2A is an enhanced view taken at section IIA of FIG. 1, according to at least one example.
Figure 2B:
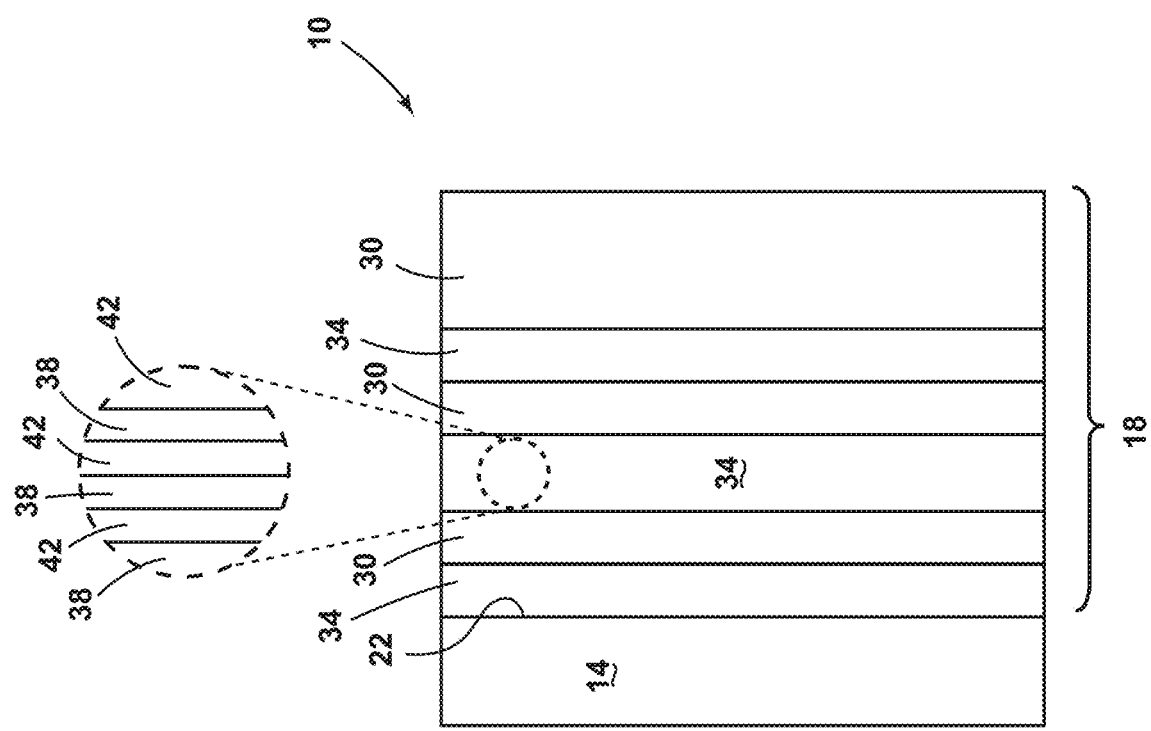
FIG. 2B is an enhanced view taken at section IIB of FIG. 1, according to at least one example.

Referring now to FIGS. 1, 2A and 2B, the film 18 may include one or more index layers 30 and one or more composite layers 34. As will be explained in greater detail below, the composite layer 34 may include two or more layers. In such examples, the composite layer 34 may be referred to as a laminate layer. In the depicted example, the film 18 includes three index layers 30 and three composite layers 34, but it will be understood that the film 18 may include one or more, two or more, four or more, five or more, or six or more index layers 30 and/or composite layers 34. According to various examples, the index layers 30 and the composite layers 34 are positioned in an alternating manner. In other words, the film 18 may be composed of alternating layers of the index layers 30 and the composite layers 34. It will be understood that other orientations of the film 18 are contemplated. For example, two or more index layers 30 or two or more composite layers 34 may be stacked on one another without departing from the teachings provided herein. Further, it will be understood that although the composite layer 34 is depicted as positioned on the curved surface 22, the index layer 30 may be the layer placed on the curved surface 22 without departing from the teachings provided herein.

The index layers 30 may be composed of at least one of $SiO_2$, $GeO_2$, SiO, AlOxNy, AlN, $SiN_x$, $Si_3N_4$, $SiO_xN_y$, $Si_uAl_vO_xN_y$, $Ta_2O_5$, $Nb_2O_5$, $TiO_2$, $ZrO_2$, Al-doped $SiO_2$, TiN, MgO, $MgF_2$, $BaF_2$, $CaF_2$, $SnO_2$, $Y_2O_3$, $MoO_3$, $DyF_3$, $YbF_3$, $YF_3$, $CeF_3$, $Sc_2O_3$ and/or combinations thereof. According to various examples, the index layers 30 may include at least $SiO_2$. Pure $SiO_2$ may be utilized in the index layers 30 in some examples where low reflectance of the film 18 is desired.

One or more of the index layers 30 may have a thickness of from about 1 nm to about 100 nm, or from about 1 nm to about 90 nm, or from about 1 nm to about 80 nm, or from about 1 nm to about 70 nm, or from about 1 nm to about 60 nm, or from about 1 nm to about 50 nm, or from about 1 nm to about 40 nm, or from about 1 nm to about 30 nm, or from about 1 nm to about 20 nm, or from about 1 nm to about 10 nm. For example, one or more of the index layers 30 may have a thickness of about 1 nm or greater, about 5 nm or greater, about 10 nm or greater, about 20 nm or greater, about 30 nm or greater, about 40 nm or greater, about 50 nm or greater, about 60 nm or greater, about 70 nm or greater, about 80 nm or greater, about 90 nm or greater, or about 100 nm or greater. For example, at least one of the index layers 30 may have a thickness of about 50 nm or greater. It will be understood that each of the index layers 30 present may have a different thickness than one or more of the other index layers 30. A total thickness of the index layers 30 (e.g., for all layers added together) may be about 5 nm or greater, about 10 nm or greater, about 20 nm or greater, about 30 nm or greater, about 40 nm or greater, about 50 nm or greater, about 60 nm or greater, about 70 nm or greater, about 80 nm or greater, about 90 nm or greater, or about 100 nm or greater. According to various examples, each of the index layers 30 has a thickness of about 1 nm or greater. According to various examples, the index layers 30 account for about 5% or greater, about 10% or greater, about 20% or greater, about 30% or greater, about 40% or greater, about 50% or greater, about 60% or greater, or about 70% or greater of the thickness of the film 18. According to various examples, one of index layers 30 may be substantially thicker than the rest of the index layers 30 of the film 18.

According to various examples, the index layers 30 may have a refractive index lower than the composite layers 34. For example, one or more of the index layers 30 may have a refractive index of about 1.2 or greater, about 1.25 or greater, about 1.3 or greater, about 1.35 or greater, about 1.4 or greater, about 1.45 or greater, about 1.5 or greater, about 1.55 or greater, about 1.6 or greater, about 1.65 or greater, about 1.7 or greater, about 1.75 or greater, about 1.8 or greater at a wavelength of about 266 nm. According to various examples, each of the index layers 30 has a refractive index of about 1.2 or greater at a wavelength of 266 nm. According to various examples, the refractive indexes of the index and composite layers 30, 34 may be different than one another such that the film 18 may function as an anti-reflective film. The difference in the refractive index of the index and composite layers 30, 34 may be about 0.01 or greater, about 0.05 or greater, about 0.1 or greater, about 0.2 or greater, about 0.3 or greater, about 0.4 or greater, about 0.5 or greater, about 0.6 or greater, about 0.7 or greater, about 0.8 or greater, about 0.9 or greater, or about 1.0 or greater.

As explained above, the film 18 also includes one or more composite layers 34. Each of the composite layers 34 may have a thickness of from about 1 nm to about 100 nm, or from about 20 nm to about 90 nm, or from about 30 nm to about 80 nm, or from about 40 nm to about 70 nm, or from about 50 nm to about 60 nm. For example, the composite layers 34 may have a thickness of about 1 nm or greater, about 5 nm or greater, about 10 nm or greater, about 20 nm or greater, about 30 nm or greater, about 40 nm or greater, about 50 nm or greater, about 60 nm or greater, about 70 nm or greater, about 80 nm or greater, about 90 nm or greater, or about 100 nm or greater. For example, at least of the composite layers 34 has a thickness of about 50 nm or greater. It will be understood that each of the composite layers 34 present may have a different thickness than one or more of the other composite layers 34. A total thickness of the composite layers 34 (e.g., for all composite layers 34 added together) may be about 5 nm or greater, about 10 nm or greater, about 20 nm or greater, about 30 nm or greater, about 40 nm or greater, about 50 nm or greater, about 60 nm or greater, about 70 nm or greater, about 80 nm or greater, about 90 nm or greater, or about 100 nm or greater. According to various examples, the composite layers 34 account for about 5% or greater, about 10% or greater, about 20% or greater, about 30% or greater, about 40% or greater, about 50% or greater, about 60% or greater, or about 70% or greater of a total thickness of the film 18. According to various examples, one of composite layers 34 may be substantially thicker than the rest of the composite layers 34 of the film 18.

According to various examples, the composite layers 34 may have a high refractive index, relative to the index layers 30. The composite layers 34 may have a refractive index of about 1.7 or greater, about 1.75 or greater, about 1.8 or greater, about 1.85 or greater, about 1.9 or greater, about 1.95 or greater, about 2.0 or greater, about 2.05 or greater, about 2.1 or greater, about 2.15 or greater, about 2.2 or greater, about 2.25 or greater, about 2.3 or greater, about 2.35 or greater, about 2.4 or greater, about 2.45 or greater, about 2.5 or greater, or about 2.6 or greater at a wavelength of 266 nm. According to various examples, each of the composite layers 34 has a refractive index of about 2.0 or greater at a wavelength of 266 nm. It will be understood that the refractive index of each of the composite layers 34 may be different than the other composite layers 34.

Referring now to FIG. 2A, depicted is an example of the composite layer 34 where the constituents of the composite layer 34 are not, or are only minimally, segregated. In one aspect, the composite layer 34 is amorphous. In another aspect, the constituents of the composite layer 34 form a solid solution or homogeneous composition. Constituents of the composite layer 34 may include $SiO_2$, $Al_2O_3$, $GeO_2$, SiO, $AlO_xN_y$, AlN, $SiN_x$, $Si_3N_4$, $SiO_xN_y$, $Si_uAl_vO_xN_y$, $Ta_2O_5$, $HfO_2$, $Nb_2O_5$, $TiO_2$, $ZrO_2$, TiN, MgO, $MgF_2$, $BaF_2$, $CaF_2$, $SnO_2$, $Y_2O_3$, $MoO_3$, $DyF_3$, $YbF_3$, $YF_3$, $CeF_3$ and/or combinations thereof. The composite layer 34 may have a refractive index of about 2.1, about 2.15, about 2.2, about 2.25, about 2.3, about 2.35, about 2.4 or any and all values and ranges therebetween. According to various examples, the composite layer 34 may be composed of $Al_2O_3$ and $HfO_2$. In such examples, the mole fraction X of $HfO_2$ may range from about 0.001 to about 1, or from about 0.05 to about 0.95, or from about 0.10 to about 0.90, or from about 0.60 to about 0.90, or from about 0.70 to about 0.90, or from about 0.75 to about 0.85, or from about 0.55 to about 0.65. For example, the mole fraction of $HfO_2$ of the composite layer 34 may be about 0.001 or greater, about 0.005 or greater, about 0.01 or greater, about 0.05 or greater, about 0.10 or greater, about 0.015 or greater, about 0.20 or greater, about 0.25 or greater, about 0.30 or greater, about 0.35 or greater, about 0.40 or greater, about 0.45 or greater, about 0.50 or greater, about 0.55 or greater, about 0.60 or greater, about 0.65 or greater, about 0.70 or greater, about 0.75 or greater, about 0.80 or greater, about 0.85 or greater, about 0.90 or greater, about 0.95 or greater, about 0.99 or greater or any and all values and ranges therebetween. The mole fraction of $Al_2O_3$ may be given by the mole fraction X of $HfO_2$ subtracted from 1. In other words, the $Al_2O_3$ mole fraction is given by 1−X. As such, the $Al_2O_3$ mole fraction in the composite layer 34 may range from about 0.001 to about 1, or from about 0.05 to about 0.95, or from about 0.10 to about 0.90. For example, the mole fraction of $Al_2O_3$ of the composite layer 34 may be about 0.001 or greater, about 0.005 or greater, about 0.01 or greater, about 0.05 or greater, about 0.10 or greater, about 0.15 or greater, about 0.20 or greater, about 0.25 or greater, about 0.30 or greater, about 0.35 or greater, about 0.40 or greater, about 0.45 or greater, about 0.50 or greater, about 0.55 or greater, about 0.60 or greater, about 0.65 or greater, about 0.70 or greater, about 0.75 or greater, about 0.80 or greater, about 0.85 or greater, about 0.90 or greater, about 0.95 or greater, about 0.99 or greater or any and all values and ranges therebetween. According to various examples, one or more of the composite layers 34 are amorphous. The composition of a composite layer 34 composed of $HfO_2$ and $Al_2O_3$ can be expressed as $XHfO_2-(1-X)Al_2O_3$ or $(HfO_2)_x(Al_2O_3)_{1-X}$. In one aspect, a composite layer 34 composed of $HfO_2$ and $Al_2O_3$ is amorphous.

Referring now to FIG. 2B depicted is a laminate example of the composite layers 34. In such examples, the composite layers 34 each include a first plurality of layers 38 and a second plurality of layers 42. It will be understood that examples of the film 18 using both the examples of FIGS. 2A and 2B of the composite layer 34 are contemplated. For example, one or more of the composite layers 34 may be a laminate while other composite layers may be homogeneous or non-segregated. According to various examples, the plurality of first and second layers 38, 42 of the composite layer 34 are stacked in an alternating order. In the depicted example, the composite layer 34 includes three first layers 38 and three second layers 42, but it will be understood that the composite layer 34 may include one or more, two or more, four or more, five or more, or six or more first layers 38 and/or second layers 42. Each of the plurality of first layers 38 may have a thickness of from about 1 nm to about 10 nm, or from about 2 nm to about 9 nm, or from about 3 nm to about 8 nm, or from about 4 nm to about 7 nm, or from about 5 nm to about 6 nm. For example each of the plurality of first layers 38 may have a thickness about 1 nm, about 2 nm, about 3 nm, about 4 nm, about 5 nm, about 6 nm, about 7 nm, about 8 nm, about 9 nm, about 10 nm or any and all values and ranges therebetween. According to various examples, each of the plurality of first layers 38 has a thickness of about 6 nm. It will be understood that the plurality of first layers 38 may have a uniform thickness or that one or more first layers 38 may have a different thickness than other first layers 38. According to various examples, the first plurality of layers 38 alternate with the second plurality of layers 42. According to various examples, the laminate layer is amorphous.

The plurality of first layers 38 may be composed of at least one of $SiO_2$, $Al_2O_3$, $GeO_2$, SiO, $AlO_xN_y$, AlN, $SiN_x$, $Si_3N_4$, $SiO_xN_y$, $Si_uAl_vO_xN_y$, $Ta_2O_5$, $HfO_2$, $Nb_2O_5$, $TiO_2$, $ZrO_2$, TiN, MgO, $MgF_2$, $BaF_2$, $CaF_2$, $SnO_2$, $Y_2O_3$, $MoO_3$, $DyF_3$, $YbF_3$, $YF_3$, $CeF_3$, $Sc_2O_3$ and/or combinations thereof. In one aspect, the first layer 38 is amorphous. According to various examples, the first plurality of layers 38 may include $HfO_2$. According to various examples, the first plurality of layers 38 may have a refractive index of about 2.1 or greater, about 2.15 or greater, about 2.2 or greater, about 2.25 or greater, about 2.3 or greater, about 2.35 or greater, about 2.4 or greater, about 2.45 or greater, about 2.5 or greater, about 2.55 or greater, about 2.6 or greater, about 2.65 or greater, about 2.7 or greater at a wavelength of 266 nm. According to various examples, each of the first layers 38 has a refractive index of about 2.3 at a wavelength of 266 nm. According to various examples, the refractive indexes of the first and second layers 38, 42 may have a difference of about 0.01 or greater, about 0.05 or greater, about 0.1 or greater, about 0.2 or greater, about 0.3 or greater, about 0.4 or greater, about 0.5 or greater, about 0.6 or greater, about 0.7 or greater, about 0.8 or greater, about 0.9 or greater, or about 1.0 or greater.

Each of the plurality of second layers 42 may have a thickness of from about 1 nm to about 10 nm, or from about 2 nm to about 9 nm, or from about 3 nm to about 8 nm, or from about 4 nm to about 7 nm, or from about 5 nm to about 6 nm. For example each of the plurality of second layers 42 may have a thickness about 1 nm, about 2 nm, about 3 nm, about 4 nm, about 5 nm, about 6 nm, about 7 nm, about 8 nm, about 9 nm, about 10 nm or any and all values and ranges therebetween. According to various examples, each of the plurality of second layers 38 has a thickness of about 4 nm. It will be understood that the plurality of second layers 42 may have a uniform thickness or that one or more second layers 42 may have a different thickness than other second layers 42.

The plurality of second layers 42 may be composed of at least one of $SiO_2$, $Al_2O_3$, $GeO_2$, SiO, $AlO_xN_y$, AlN, $SiN_x$, $Si_3N_4$, $SiO_xN_y$, $Si_uAl_vO_xN_y$, $Ta_2O_5$, $HfO_2$, $Nb_2O_5$, $TiO_2$, $ZrO_2$, TiN, MgO, $MgF_2$, $BaF_2$, $CaF_2$, $SnO_2$, $Y_2O_3$, $MoO_3$, $DyF_3$, $YbF_3$, $YF_3$, $CeF_3$ and/or combinations thereof. In one aspect, the second layer 42 is amorphous. According to various examples, the second plurality of layers 42 may include $Al_2O_3$. According to various examples, the second plurality of layers 42 may have a refractive index of about 1.5 or greater, about 1.55 or greater, about 1.6 or greater, about 1.65 or greater, about 1.7 or greater, about 1.75 or greater, about 1.8 or greater, about 1.85 or greater, about 1.9 or greater, about 1.95 or greater, about 2.0 or greater, about 2.05 or greater, or about 2.1 or greater at a wavelength of 266 nm. According to various examples, each of the second layers 42 has a refractive index of about 1.7 at a wavelength of 266 nm.

The first plurality of layers 38 may be from about 0.1% to about 99%, or from about 10% to about 90%, or from about 20% to about 80%, or from about 30% to about 75%, or from about 50% to about 70%, or from about 52% to about 68%, or from about 54% to about 66%, or from about 56% to about 64%, or from about 58% to about 62% of a thickness of the composite layer 34. For example, the first plurality of layers 38 may account for about 50%, or about 51%, or about 52%, or about 53%, or about 54%, or about 55%, or about 56%, or about 57%, or about 58%, or about 59%, or about 60%, or about 61%, or about 62%, or about 63%, or about 64%, or about 65%, or about 66%, or about 67%, or about 68%, or about 69% or about 70% of the thickness of the composite layer 34. The second plurality of layers 42 may be from about 30% to about 50%, or from about 32% to about 48%, or from about 34% to about 46%, or from about 36% to about 44%, or from about 38% to about 42% of a thickness of the composite layer 34. For example, the second plurality of layers 42 may account for about 30%, or about 31%, or about 32%, or about 33%, or about 34%, or about 35%, or about 36%, or about 37%, or about 38%, or about 39%, or about 40%, or about 41%, or about 42%, or about 43%, or about 44%, or about 45%, or about 46%, or about 47%, or about 48%, or about 49% or about 50% of the thickness of the composite layer 34.

Use of the first and second pluralities of layers 38, 42 may be advantageous in decreasing a roughness of the composite layer 34 and overall the film 18. Such a feature may be advantageous in increasing optical properties of the film 18. For examples, as HfO$_2$ containing examples of the first layers 38 are produced, crystallites or grains of the HfO$_2$ may grow, or increase in size, as the first layer 38 is formed. Such growth of the crystallites may result in grain coarsening which overall increases the roughness of the composite layer 34 and the film 18. As such, by introducing the second layers 42, which have a different microstructure (e.g., amorphous) than the first layers 38, the growth of the large crystals may be interrupted, disrupted, or reset. Interrupting, or resetting, of the growth point for the first layers 38 allows the grain size for the first layers 38 to begin again with fine grains. Use of the second layers 42 may allow first layers 38 formed on top of the second layer 42 to have an average microstructural crystal size that is smaller than an average microstructural crystal size of first layers grown without the second layers 42. According to various examples, each layer of the first plurality of layers 38 is amorphous and each layer of the second plurality of layers 42 is amorphous.

"Roughness," "average surface roughness (Ra)," or like terms refer to, on a microscopic level or below, an uneven or irregular surface condition, such as an average root mean squared (RMS) roughness (Rq). Ra is calculated as the roughness average of a surface's measured microscopic peaks and valleys. Rq is calculated as the RMS of a surface's measured microscopic peaks and valleys. When described in terms of Rq, the roughness of the film 18, the composite layer 34 and/or the index layer 30 may be about 20 nanometers or less, about 19 nm or less, about 18 nm or less, about 17 nm or less, about 16 nm or less, about 15 nm or less, about 14 nm or less, about 13 nm or less, about 12 nm or less, about 11 nm or less, about 10 nm or less, about 9 nm or less, about 8 nm or less, about 7 nm or less, about 6 nm or less, about 5 nm or less, about 4 nm or less, about 3 nm or less, about 2 nm or less or about 1 nm or less. When described in terms of Ra, the roughness may be about 20 nm or less, about 19 nm or less, about 18 nm or less, about 17 nm or less, about 16 nm or less, about 15 nm or less, about 14 nm or less, about 13 nm or less, about 12 nm or less, about 11 nm or less, about 10 nm or less, about 9 nm or less, about 8 nm or less, about 7 nm or less, about 6 nm or less, about 5 nm or less, about 4 nm or less, about 3 nm or less, about 2 nm or less or about 1 nm or less.

According to various examples, the individual layer thickness of the first and second plurality of layers 38, 42 may be much smaller than the quarter-wave thicknesses of their constituents. For example, the quarter-wave thickness of HfO$_2$ (e.g., the first layers 38) may be about 29.7 nm at a wavelength of 266 nm and the quarter-wave thickness of Al$_2$O$_3$ (e.g., the second layers 42) may be about 38.4 nm at a wavelength of 266 nm. As such, the composite layer 34 may optically be considered to be homogenous despite the discrete layering of its constituents. Accordingly, the refractive index and/or quarter-wave thickness of the composite layer 34 may be a combination of the refractive index and quarter wave thickness of the first and second layers 38, 42 based on the relative proportions of the first and second layers 38, 42.

According to various examples, the optical element 10 including the lens 14 and the film 18 (i.e., in either the non-segregated or laminate examples of the composite layer 34) exhibits a variance in reflectance between S-polarization and P-polarization of from about 0% to about 1% over an angle of incidence of from about 0° to about 45° at 266 nm, or from about 0° to about 58° at 266 nm as measured by spectroscopic ellipsometry at a normal angle of incidence. For example, the variance in reflectance between S-polarization and P-polarization may be about 0.9%, about 0.8%, about 0.7%, about 0.6%, about 0.5%, about 0.4%, about 0.3%, about 0.2%, or about 0.1% over an angle of incidence of from about 0° to about 45° at 266 nm, or from about 0° to about 58° at 266 nm as measured by spectroscopic ellipsometry at a normal angle of incidence. According to specific examples, the variance in reflectance between S-polarization and P-polarization may be about 0% to about 0.4% or from about 0% to about 0.2% over an angle of incidence from about 0° to about 45° at 266 nm as measured by spectroscopic ellipsometry at a normal angle of incidence.

The film 18 may exhibit a small variation in reflectance over a wavelength band of from about 220 nm to about 500 nm as measured between about a 0.0 ca clear aperture value and a 0.96 ca clear aperture value of the lens 14 using reflective spectral microscopy. According to various examples, the variation in reflectance may be from about 0% to about 10%, or from about 0% to about 9%, or from about 0% to about 8%, or from about 0% to about 7%, or from about 0% to about 6%, or from about 0% to about 5%, or from about 0% to about 4%, or from about 0% to about 3%, or from about 0% to about 2%, or from about 0% to about 1%, or from about 0% to a out 0.1%. For example, the variation in reflectance may be about 0%, about 0.1%, about 0.5%, about 1%, about 1.5%, about 2%, about 2.5%, about 3%, about 3.5%, about 4%, about 4.5%, about 5%, about 5.5%, about 6%, about 6.5%, about 7%, about 7.5%, about 8%, about 8.5%, about 9%, about 9.5%, about 10% or any and all values and ranges therebetween.

Figure 3:
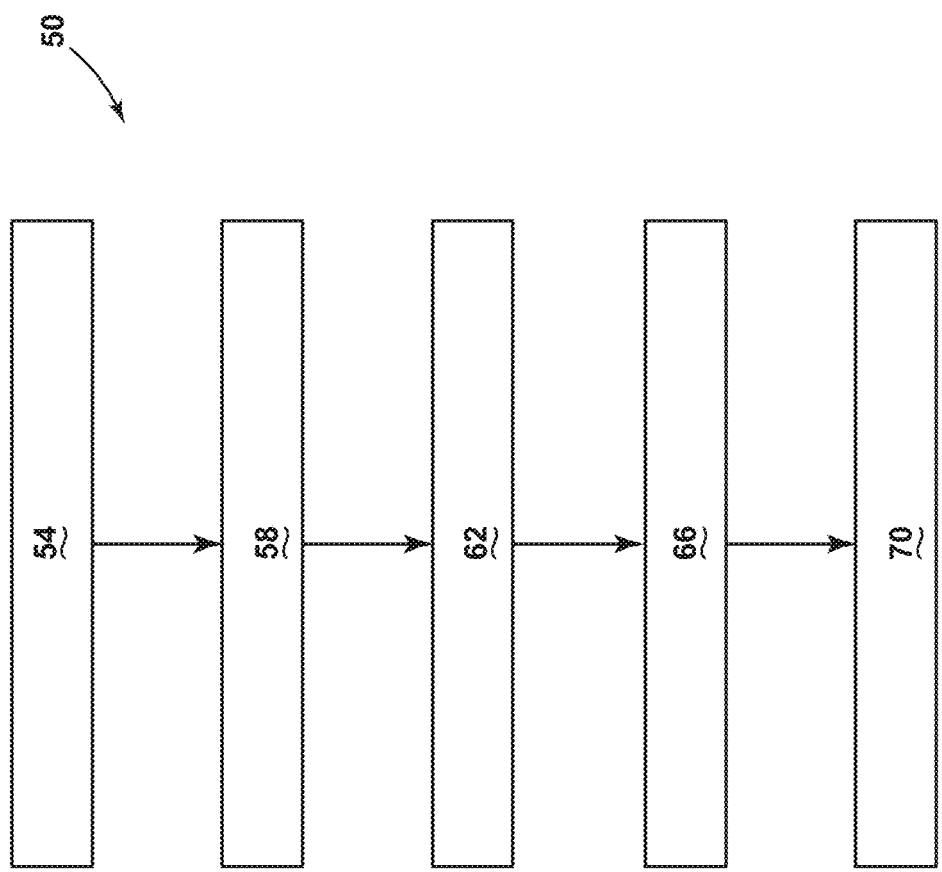
FIG. 3 is a flowchart of an exemplary method of forming the optical element, according to at least one example.

Referring now to FIG. 3, depicted is an exemplary method 50 of forming the optical element 10. The method 50 may begin with a step 54 of positioning the substantially transparent lens 14 in a reactor chamber, wherein the lens 14 defines the curved surface 22. According to various examples, the lens 14 may have a steepness given by an R/# value of from about 0.5 to about 1.0. According to various examples, the reactor may be an atomic layer deposition reactor. In such examples, the lens 14 may be positioned within the reactor such that one or more precursors and/or oxidizers which enter the reactor contact the curved surface 22. Atomic layer deposition is a thin film growth technique based on the sequential exposure of a substrate to self-limiting surface half-reactions.

Next, a step 58 of exposing the lens 14 to a first precursor including at least one of Al and Hf such that the first precursor is deposited on the curved surface 22 of the lens 14 is performed. Although Al and Hf have been specifically called out, it will be understood that the first precursor may include any of the compounds noted above in connection with the composite layer 34 without departing from the teachings provided herein. The first precursor may be exposed to the curved surface 22 for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.2 s. For example, the first precursor may be exposed to the curved surface 22 of the lens 14 for about 0.1 s, about 0.2 s, about 0.3 s, about 0.4 s, about 0.5 s, about 0.6 second and any and all values and ranges therebetween. The first precursor may be composed of compounds containing Al and/or Hf which may include organics and/or halides of Al and Hf. For example, the first precursor may include at least one of Trimethylaluminum, aluminum acetylacetonate, dimethylaluminum i-propoxid, Tetrakis(diethylamino)hafnium, Tetrakis(ethylmethylamino) hafnium, $HfCl_4$, $HfI_4$, $HfClxH_{1-x}$, $HfCl_xI_{1-x}$, $HFBr_4$, other Al and/or Hf containing compounds and/or combinations thereof. Once the first precursor has been exposed to the curved surface 22 for the predetermined time, the reactor may be purged for about 0.5 s, about 1 s, about 1.5 s, about 2 s, about 2.5 s, about 3 s, about 3.5 s, about 4 s or for about 5 s or greater. It will be understood that the first precursor may be used to form both the non-segregated and laminate examples of the composite layer 34. For example, the first precursor may include both Al and Hf containing compounds to form the non-segregated composite layer 34. In another example, the first precursor may include only one of Al or Hf to form either of the first or second plurality of layers 38, 42. According to various examples, the first precursor includes Hf and a halide.

Next, a first oxidizer may be introduced to the reactor in a step 62 of exposing the first precursor on the curved surface 22 to the first oxidizer such that the first precursor present on the curved surface 22 of the lens reacts with the first oxidizer to form a high refractive index layer of the film 18 is performed. According to various examples, the high index layer may be either of the first or second plurality of layers 38, 42 or the non-segregated composite layer 34. The first oxidizer may include water vapor, ozone, other materials which may oxidize the first precursor and/or combinations thereof. The first oxidizer may be exposed to the first precursor for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.2 s. For example, the first oxidizer may be exposed to the first precursor for about 0.1 s, about 0.2 s, about 0.3 s, about 0.4 s, about 0.5 s, about 0.6 second and any and all values and ranges therebetween. It will be understood that steps 58 and 62 may be repeated until a desired thickness (e.g., of the composite layer 34, the first layers 38 and/or second layers 42) is reached.

Next, a step 66 of exposing the high refractive index layer to a second precursor such that the second precursor is deposited on the high refractive index layer is performed. The second precursor may be exposed to the high refractive index layer for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.1 s to about 0.2 s. For example, the second precursor may be exposed to the curved surface 22 of the lens 14 for about 0.1 s, about 0.2 s, about 0.3 s, about 0.4 s, about 0.5 s, about 0.6 second and any and all values and ranges therebetween. The second precursor may include tris(dimethylamino)silane, bis(diethylamino)silane, N-(diethylaminosilyl)-N-ethylethanamine, other silicon-containing compounds, other precursors of low index materials and/or combinations thereof. Once the second precursor has been exposed to the high refractive index layer for the predetermined time, the reactor may be purged for about 0.5 s, about 1 s, about 1.5 s, about 2 s, about 2.5 s, about 3 s about 3.5 s, about 4 s or for about 5 s or greater.

Next, a step 70 of exposing the second precursor on the high refractive index layer to a second oxidizer such that the second precursor present on the high refractive index layer reacts with the second oxidizer to form a low refractive index layer of the film 18 is performed. According to various examples, the low refractive index layer may be the index layer 30. The second oxidizer may include water vapor, ozone, other materials which may oxidize the second precursor and/or combinations thereof. The second oxidizer may be exposed to the second precursor for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.1 s to about 0.2 s. For example, the second oxidizer may be exposed to the second precursor for about 0.1 s, about 0.2 s, about 0.3 s, about 0.4 s, about 0.5 s, about 0.6 second and any and all values and ranges therebetween.

According to various examples, steps 54-70 may be performed at an elevated temperature. For example, steps 54-70 may be performed at a temperature of from about 20° C. to about 400° C., or from about 100° C. to about 400° C., or from about 200° C. to about 300° C. For example, steps 54-70 may be performed at a temperature of about 20° C., about 30° C., about 40° C., about 50° C., about 60° C., about 70° C., about 80° C., about 90° C., about 100° C., about 150° C., about 200° C., about 250° C., about 300° C., about 350° C., about 400° C. or any and all ranges and values therebetween. It will be understood that all the values and ranges disclosed above may be the temperature of the lens 14, and layers formed on the lens 14 and/or the temperature at which the first and/or second precursors and/or oxidizers are introduced to the reactor. For example, the method 50 may include a step of heating the substantially transparent lens 14 to a temperature of from about 50° C. to about 350° C.

It will be understood that although the steps of the method 50 were described in a particular order, the method 50 may include additional steps, omit steps, be repeated or performed in any order where applicable without departing from the teachings provided herein.

Use of the present disclosure may offer a variety of advantages. First, as the composite layer 34 includes the first plurality of layers 38 and the second plurality of layers 42, the roughness of the overall film 18 may be reduced. As explained above, by stacking the first and second layers 38, 42, crystallite growth may be reduced which may decrease the roughness of the film 18. As roughness of the film 18 may cause an increased scattering of light incident on the film 18, reduction of the roughness of the film 18 may improve optical properties (e.g., scattering loss, reflection, polarization control, etc.) of the film 18 and optical element 10. Second, use of atomic layer deposition to produce the film 18 may offer a variety of advantages. For example, use of atomic layer deposition provides a self-limiting film growth technology which enabling precise thickness control of various layers of the film 18 as well as the opportunity to simultaneously multiple surfaces of lens 14 as well as the ability to coat multiple lenses 14 simultaneously. Third, the use of atomic layer deposition allows high, or steep, curvature surfaces such as the curved surfaces 22 to be evenly coated while minimizing or eliminating conventional masking processes. Fourth, as the atomic layer deposition process may simplify tooling fixtures used to secure the lens 14 within the reactor, a reduced risk of mechanical damage to the lenses 14 may be realized as compared to conventional physical vapor deposition processes. Fifth, as the film 18 may be formed with a relatively low carbon impurity content, the film 18 may have a variety of beneficial optical properties.

Examples

Provided below are a number of non-limiting examples of the present disclosure.

Figure 4:
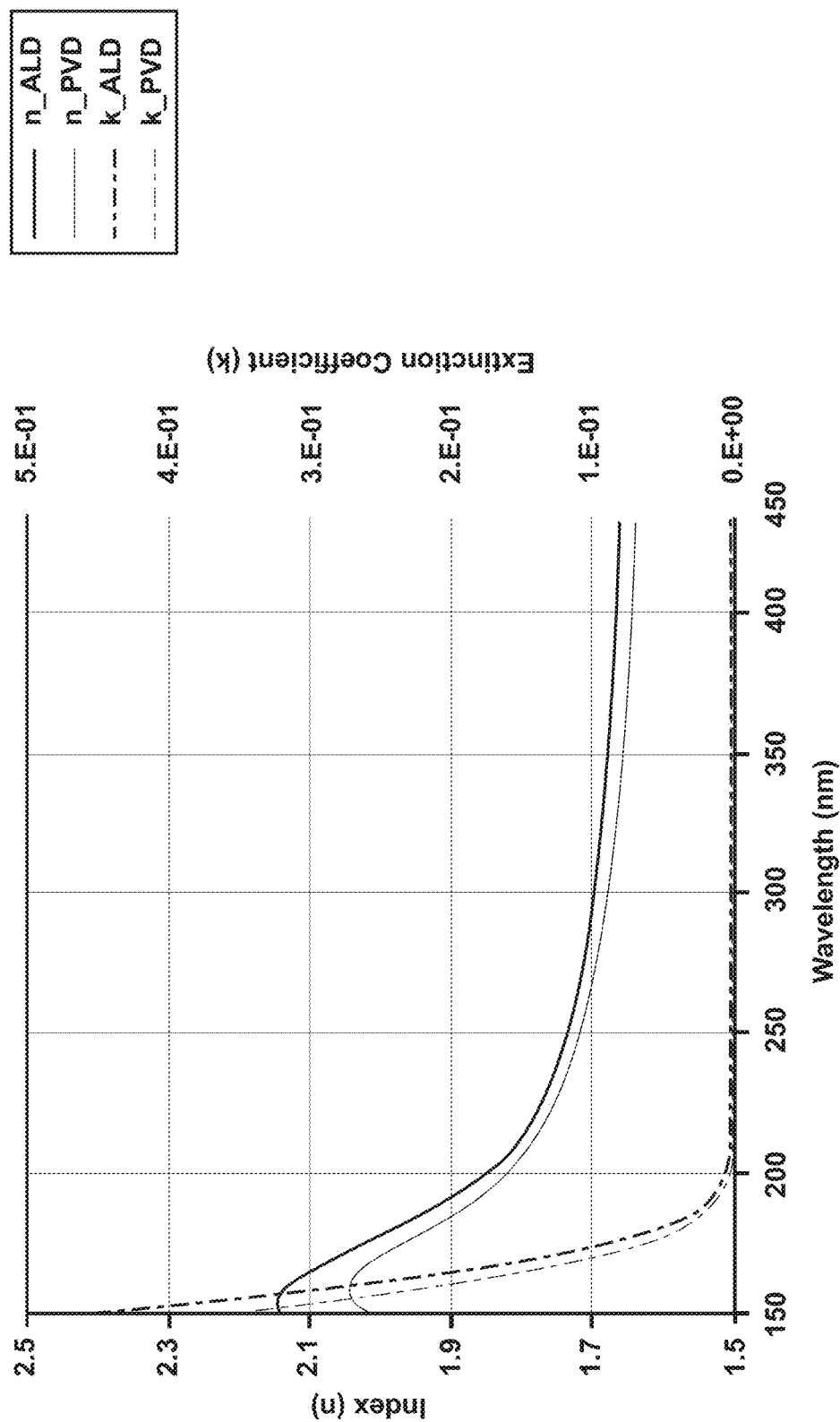
FIG. 4 is a plot of index and extinction coefficient of an atomic layer deposition coating $Al_2O_3$ and a physical vapor deposition coating of $Al_2O_3$.

Referring now to FIG. 4, provided is a plot of ellipsometry data of a layer of $Al_2O_3$ formed via atomic layer deposition (e.g. one example of the second plurality of layers 42) and a layer of $Al_2O_3$ formed via physical vapor deposition. As illustrated by FIG. 4, atomic layer deposition of $Al_2O_3$ leads to an increase in the refractive index (n) and extinction coefficient (k) at lower wavelengths (e.g., about 175 nm to about 450 nm) as compared to physical vapor deposition examples. Such optical properties achieved by the use of atomic layer deposition to form layers of $Al_2O_3$ in a coating (e.g., the film 18) may be advantageous in increasing the difference in refractive index between layers of the coating which may be advantageous for antireflective coatings.

Figure 5:
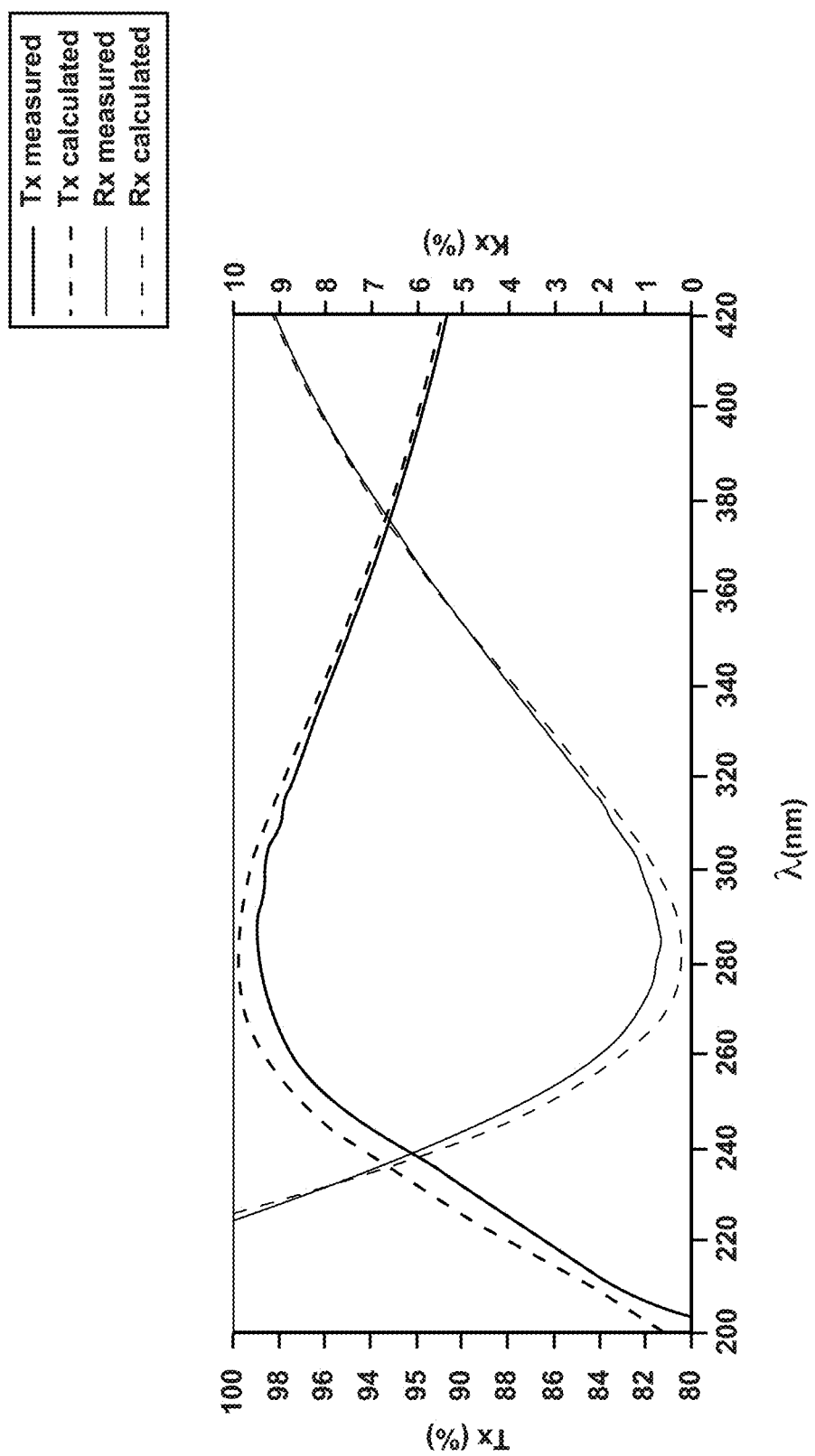
FIG. 5 is a plot of measured and calculated reflectance and transmittance vs. wavelength.

Referring now to FIG. 5, provided is a plot of measured and calculated reflectance (Rx) and transmittance (Tx) spectra on a 1 in x 1 mm $SiO_2$ substrate with an antireflective coating having a layer of $SiO_2$ and a layer of $Al_2O_3$ applied via atomic layer deposition simultaneously on both sides of the substrate. The thickness of the $Al_2O_3$ coatings was 40.5 nm and the $SiO_2$ coatings had a thickness of 48.3 nm. The $Al_2O_3$ was deposited using Trimethylaluminum (TMA) as the metal precursor and water as the oxidant at about 200° C. to about 300° C. The complete growth cycle was 0.2 s TMA, followed by a 3 s purge, followed by 0.3 s of $H_2O$, followed by a 3 s purge. The growth rate was 1 Å/cycle. The $SiO_2$ was deposited using tris[dimethylamino] silane as the precursor and ozone as the oxidizer at about 100° C. to about 300° C. The measured and calculated values for the reflectance and transmittance are for a 5° angle of incidence of light on the substrate and coating. As can be seen from FIG. 5, the atomic layer deposition process of forming the coating allows for the formation of $Al_2O_3$ and $SiO_2$ layers which nearly perfectly conform to optical models. As such, by utilizing atomic layer deposition to form the coating, optical lenses formed according to the present disclosure may closely match that of predicted models.

Figure 6A:
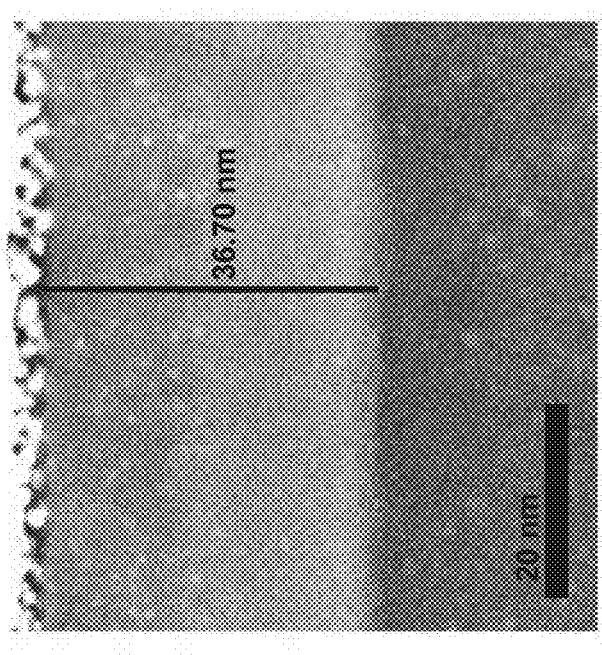
FIG. 6A is a micrograph of a film coating on a lens at an apex of the lens.
Figure 6B:
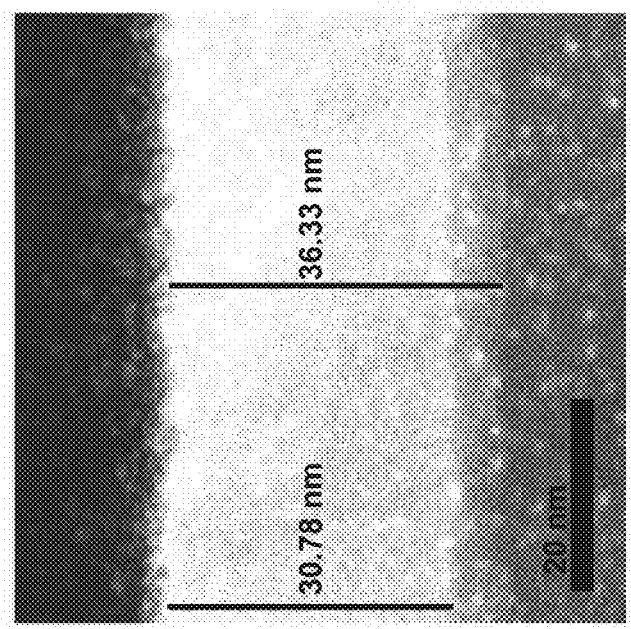
FIG. 6B is a micrograph of a film coating on a lens at an edge of the lens.

Referring now to FIGS. 6A and 6B, provided are micrographs of a first example (Example 1) of the present disclosure illustrating an optical lens (e.g., the lens 14) having a coating (e.g. the film 18) disposed on a shaped surface (e.g., the curved surface 22). The shaped surface had an R/# value of about 0.5 representing a hemispherical lens. The optical lens had a diameter of about 4 mm and a radius of curvature of 2 mm. In Example 1, $Al_2O_3$ was deposited on the optical lens during an atomic layer deposition process using trimethylaluminum as a metal precursor and water as the oxidant at a temperature of from about 200° C. to about 300° C. in a reactor. The growth of the coating was performed by supplying trimethylaluminum to the reactor for about 0.2 seconds, purging the trimethylaluminum from the reactor for about 3 seconds, supplying water vapor for about 0.3 seconds, and purging the water vapor for about 3 seconds. The growth rate of the coating was about 1 Å per cycle. The thickness of the $Al_2O_3$ coating was about 36 nm. FIG. 6A is a micrograph of a peak, or apex, of a top of the optical lens at a clear aperture value of about 0 ca and FIG. 6B is a micrograph of an edge of the optical lens with a clear aperture value of about 0.9 ca. As can be seen in FIGS. 6A and 6B, a thickness variation across of the coating across the optical lens between the 0 ca value and 0.9 ca value is less than 2% (36.33 nm vs. 36.70 nm) despite the high curvature of the hemispherically shaped surface. The micrographs of FIGS. 6A and 6B indicate that in addition to providing better optical qualities, use of the atomic layer deposition process may achieve highly uniform coatings across steeply curved surfaces (i.e., without traditional masking steps) which may be advantageous in ensuring consistent optical properties across the coating.

Figure 7A:
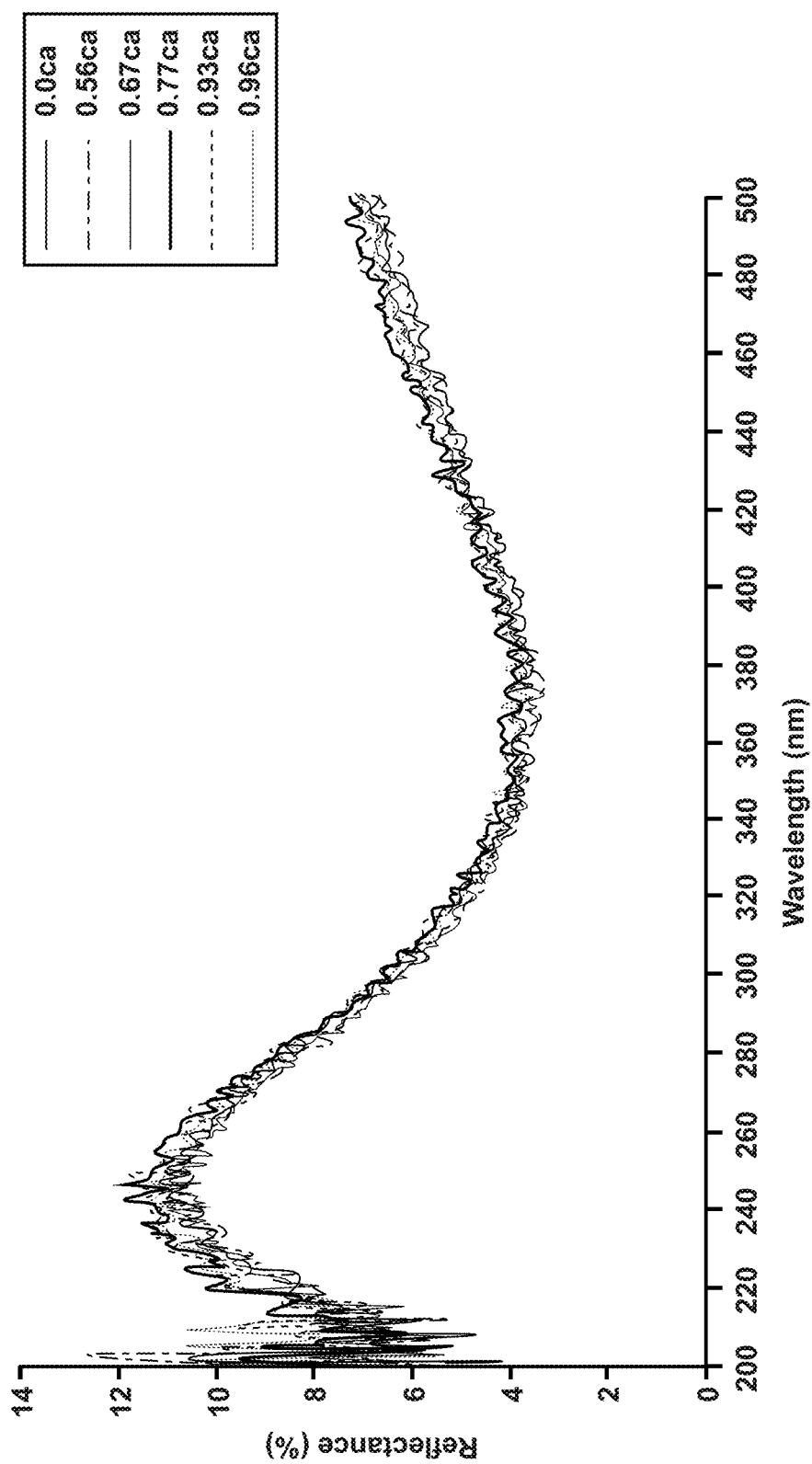
FIG. 7A is a plot demonstrating reflectance (%) vs. wavelength of various points on an optical lens having a coating.
Figure 7B:
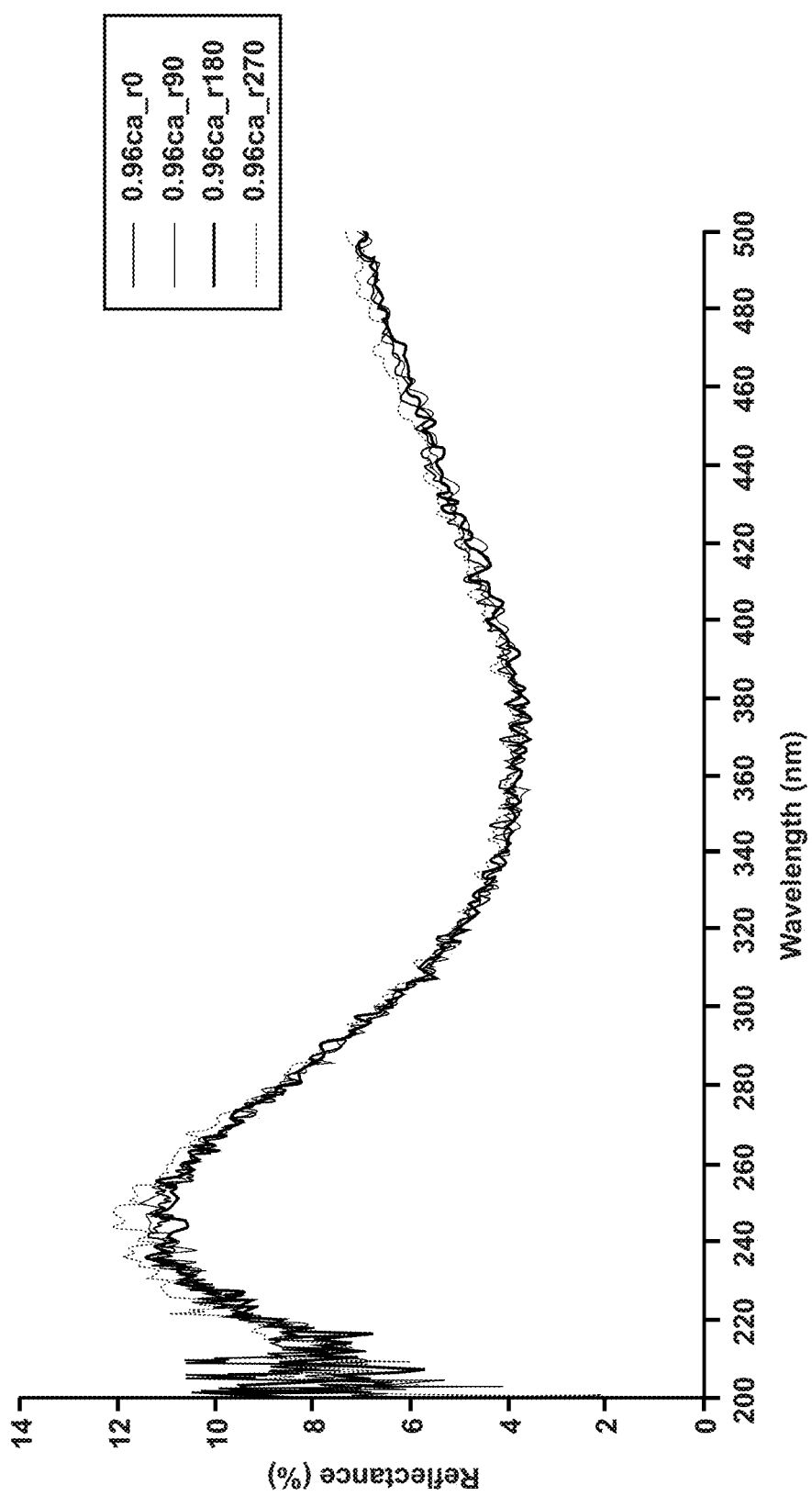
FIG. 7B is a plot demonstrating reflectance (%) vs. wavelength of various points on an optical lens having a coating.

Referring now to FIGS. 7A and 7B, provided is reflectance data of a second example (i.e., Example 2) at various points clear aperture (ca) along an optical lens. The optical lens was an $SiO_2$ hemispherical lens with a 2 mm radius of curvature. The optical lens included a 109 nm thick $Al_2O_3$ coating. The $Al_2O_3$ was deposited using Trimethylaluminum (TMA) as the metal precursor and water as the oxidant at about 200° C. to about 300° C. The complete growth cycle was 0.2 s TMA, followed by a 3 s purge, followed by 0.3 s of $H_2O$, followed by a 3 s purge. The growth rate was 1 Å/cycle. The plots of FIGS. 7A and 7B provide percent reflectance vs. wavelength for points along the optical lens radiating from the center to the edge (FIG. 7A) and rotated (FIG. 7B) along 90° polar increments (e.g., r0 being north, r90 being east, r180 being south and r270 being west) at a constant clear aperture value of 0.96 ca. FIG. 7A indicates that there is about 2% or less variance in the reflectance between the various clear aperture values of the film. FIG. 7B indicates that there was essentially no asymmetry in reflectance between 90° separated points around the optical lens at a clear aperture value of about 0.96 ca. As reflection is a function coating uniformity, and as the reflectance across the various points of the optical lens are substantially uniform (e.g., have a variance of about 2% or less), the atomic layer deposition of the $Al_2O_3$ coating provides a uniform coating not only with respect to clear aperture value of the optical lens, but also rotationally (azimuthally) around the optical lens.

Figure 8:
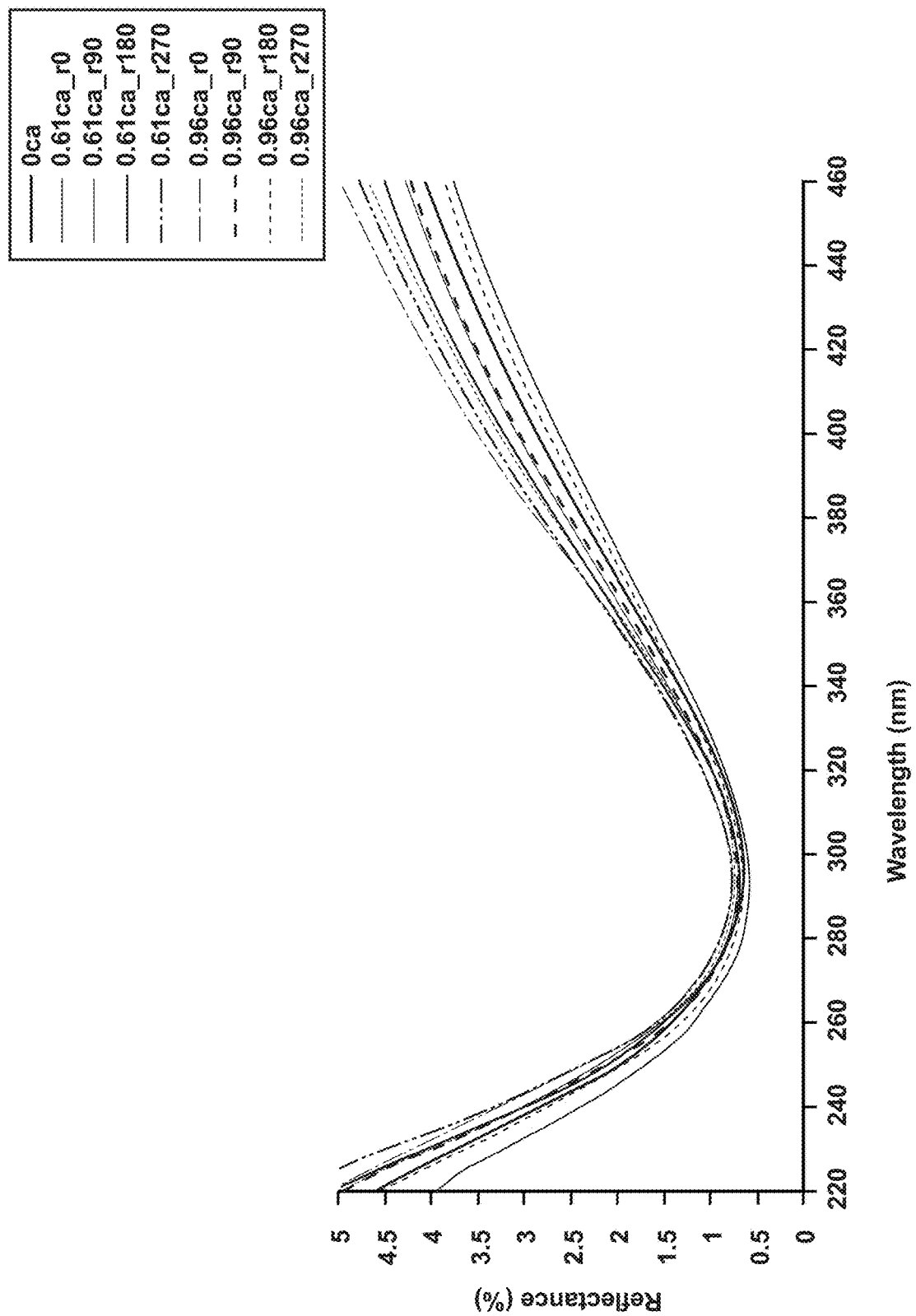
FIG. 8 is a measured reflectance spectral distribution taken at various points on an optical lens having a coating.

Referring now to FIG. 8, provided is a plot of measured reflectance spectral distribution of a third example (i.e., Example 3) of the present disclosure. Example 3 includes a coating having a $SiO_2$ layer and an $Al_2O_3$ layer to form an antireflection coating on a 4 mm diameter $SiO_2$ hemisphere lens with a 2 mm radius of curvature. The thickness of the $Al_2O_3$ coatings was 40.5 nm and the $SiO_2$ coatings had a thickness of 48.3 nm. The $Al_2O_3$ was deposited using Trimethylaluminum (TMA) as the metal precursor and water as the oxidant at about 200° C. to about 300° C. The complete growth cycle was 0.2 s TMA, followed by a 3 s purge, followed by 0.3 s of $H_2O$, followed by a 3 s purge. The growth rate was 1 Å/cycle. The $SiO_2$ was deposited using tris[dimethylamino] silane as the precursor and ozone as the oxidizer at about 100° C. to about 300° C. FIG. 8 provides the reflectance of Example 3 measured at a 0.61 clear aperture (0.61 ca) value and 0.96 clear aperture (0.96 ca) value and at various polar coordinates around Example 3 (e.g., r0 being north, r90 being east, r180 being south and r270 being west). As reflection is a function coating uniformity, and as the reflectance across the various points of the coating have approximately the same minimum reflectance around 285 nm, the data indicates a uniform and symmetrical antireflective coating across the hemisphere lens when measured near the circumference of the lens.

Referring now to FIGS. 9A-9G depicted are calculated plots of optical data for six different examples consistent with the optical element 10 of the present disclosure. Each of the examples, where indicated by relative proportions (e.g., in mole percent) of constituents, have nano-laminated examples of mixed layers (e.g., segregated examples of the composite layer 34). As explained above, mixed layers with a plurality of layers (e.g., the first and second layers 38, 42) with thicknesses much thinner than quarter wave thicknesses of the composition of the layers allow the mixed layer to optically be treated as a single layer with the optical properties of the mixed layer being based on the relative proportions of the layers within the mixed layer. Further, examples of the mixed layer where its constituents are homogenous, and non-segregated, may also exhibit optical properties based on the relative proportions of the constituents within the mixed layer. As such, the optical properties provided in FIGS. 9A-9G are consistent with all examples of the optical element 10. The plots of FIGS. 9A-9G are provided as percent reflectance over an angle of incidence of from about 0° to about 45° at 266 nm as measured by spectroscopic ellipsometry. As can be seen from the plots of FIGS. 9A-9G, the variation between the S-polarization and P-polarization is low indicating a low optical retardation. As optical retardation is generally caused by stress in the coating, non-uniformity of the coating, curvature of the optical lens and other deleterious factors, the low variation in polarization indicates a uniform and low-stress coating.

Figure 9A:
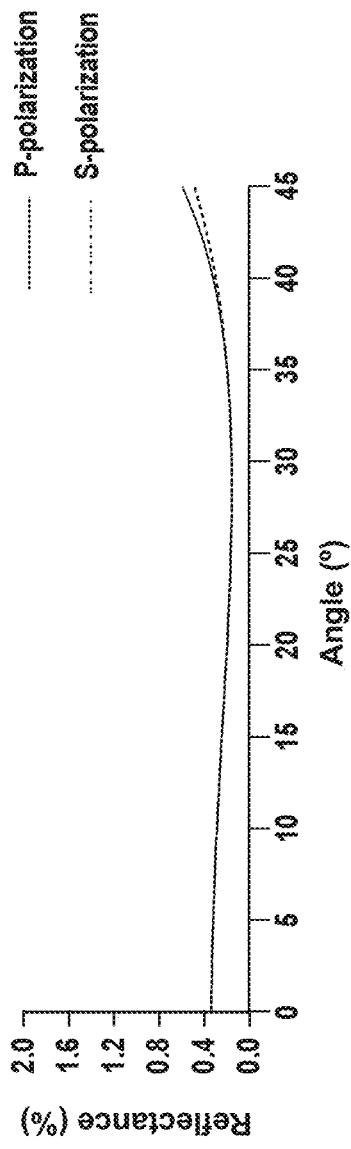
FIGS. 9A-9G are plots of S-polarization and P-polarization reflectance (%) vs angle of incidence for a variety of coatings having different compositions.

Referring now to FIG. 9A, depicted is the S-polarization and P-polarization reflection of a six-layer antireflection coating positioned on an $SiO_2$ 2 mm radius of curvature hemispherical lens at 266 nm according to a fourth example (i.e., Example 4). The antireflection coating of FIG. 9A has a layered structure, from the lens outward, of 5.27 nm of $HfO_2$, 11.9 nm of $SiO_2$, 70.28 nm of $HfO_2$, 10.96 nm of $SiO_2$, 33.46 nm of $HfO_2$ and 52.28 nm of $SiO_2$.

Figure 9B:
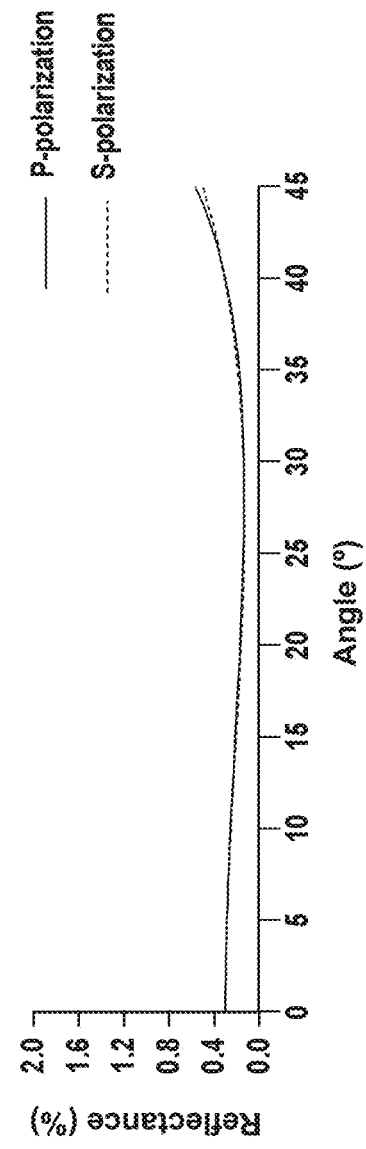

Referring now to FIG. 9B, depicted is the S-polarization and P-polarization reflection of a six-layer antireflection coating positioned on an $SiO_2$ 2 mm radius of curvature hemispherical lens at 266 nm according to a fifth example (i.e., Example 5). The antireflection coating of FIG. 9B has a layered structure, from the lens outward given in thicknesses, of 5.33 nm of $HfO_2/Al_2O_3$, 9.07 nm of $SiO_2$, 70.17 nm of $HfO_2/Al_2O_3$, 12.48 nm of $SiO_2$, 36.94 nm of $HfO_2/Al_2O_3$ and 51.32 nm of $SiO_2$. The relative molar proportions of $HfO_2$ to $Al_2O_3$ for FIG. 9B are 90% $HfO_2$ and 10% $Al_2O_3$.

Figure 9C:
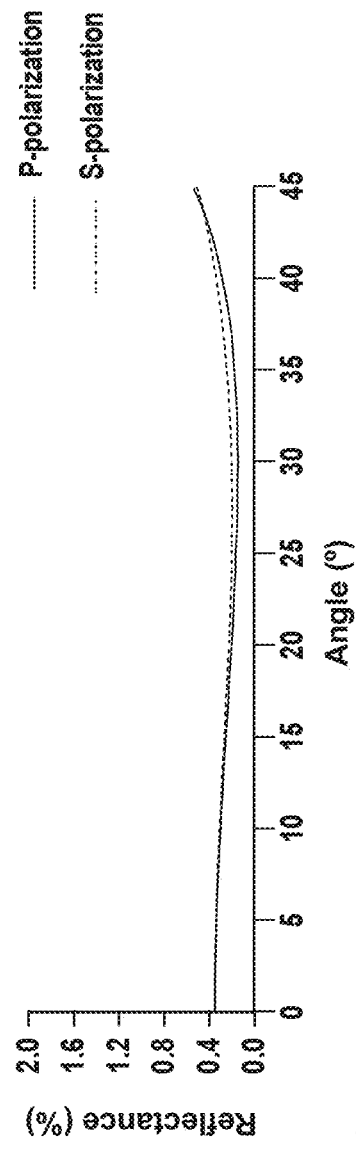

Referring now to FIG. 9C, depicted is the S-polarization and P-polarization reflection of a six-layer antireflection coating positioned on an $SiO_2$ 2 mm radius of curvature hemispherical lens at 266 nm according to a sixth example (i.e., Example 6). The antireflection coating of FIG. 9C has a layered structure, from the lens outward given in thicknesses, of 6.33 nm of $HfO_2/Al_2O_3$, 9.07 nm of $SiO_2$, 70.17 nm of $HfO_2/Al_2O_3$, 12.48 nm of $SiO_2$, 37.94 nm of $HfO_2/Al_2O_3$ and 51.32 nm of $SiO_2$. The relative molar proportions of $HfO_2$ to $Al_2O_3$ for FIG. 9C are 80% $HfO_2$ and 20% $Al_2O_3$.

Figure 9D:
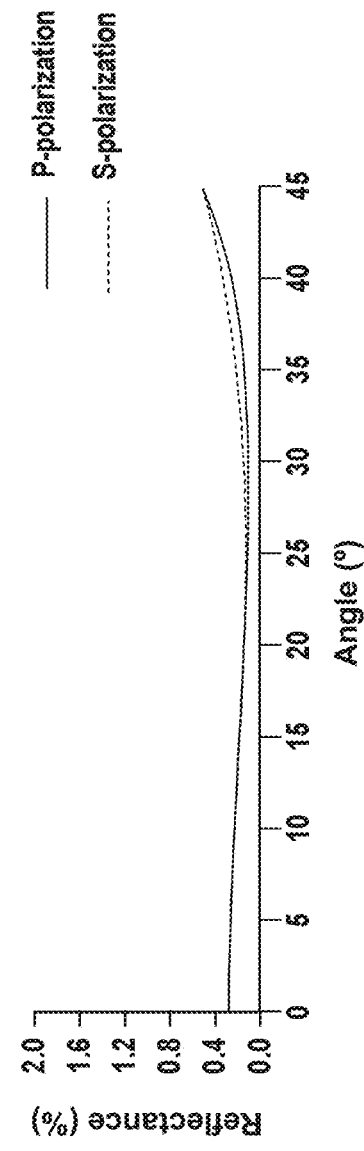

Referring now to FIG. 9D, depicted is the S-polarization and P-polarization reflection of a six-layer antireflection coating positioned on an $SiO_2$ 2 mm radius of curvature hemispherical lens at 266 nm according to a seventh example (i.e., Example 7). The antireflection coating of FIG. 9D has a layered structure, from the lens outward given in thicknesses, of 6.8 nm of $HfO_2/Al_2O_3$, 4.71 nm of $SiO_2$, 69.9 nm of $HfO_2/Al_2O_3$, 16.41 nm of $SiO_2$, 40.24 nm of $HfO_2/Al_2O_3$ and 50.54 nm of $SiO_2$. The relative molar proportions of $HfO_2$ to $Al_2O_3$ for FIG. 9D are 70% $HfO_2$ and 30% $Al_2O_3$.

Figure 9E:
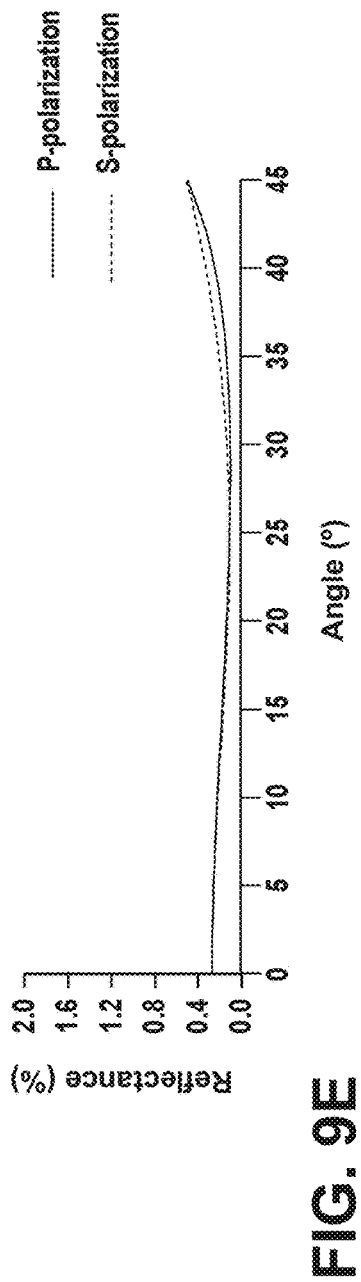

Referring now to FIG. 9E, depicted is the S-polarization and P-polarization reflection of a six-layer antireflection coating positioned on an $SiO_2$ 2 mm radius of curvature hemispherical lens at 266 nm according to an eighth example (i.e., Example 8). The antireflection coating of FIG. 9E has a layered structure, from the lens outward given in thicknesses, of 7.65 nm of $HfO_2/Al_2O_3$, 1.36 nm of $SiO_2$, 69.76 nm of $HfO_2/Al_2O_3$, 20.6 nm of $SiO_2$, 42.03 nm of $HfO_2/Al_2O_3$ and 49.61 nm of $SiO_2$. The relative molar proportions of $HfO_2$ to $Al_2O_3$ for FIG. 9E are 60% $HfO_2$ and 40% $Al_2O_3$.

Figure 9F:
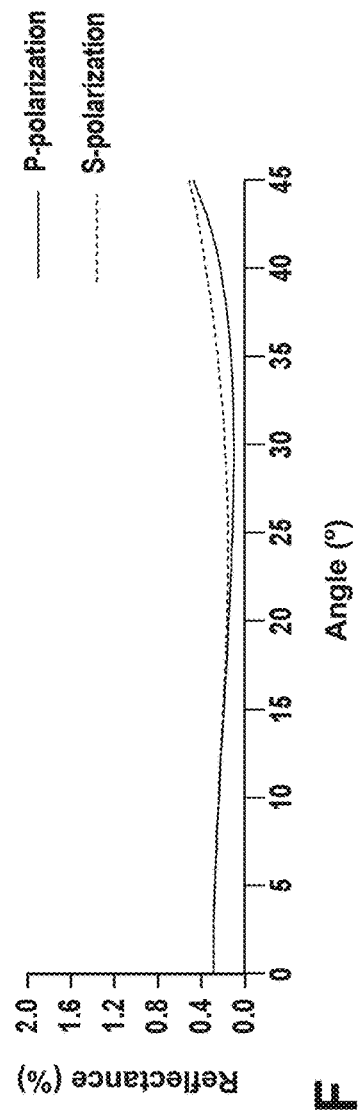

Referring now to FIG. 9F, depicted is the S-polarization and P-polarization reflection of a six-layer antireflection coating positioned on an $SiO_2$ 2 mm radius of curvature hemispherical lens at 266 nm according to a ninth example (i.e., Example 9). The antireflection coating of FIG. 9F has a layered structure, from the lens outward given in thicknesses, of 6.49 nm of $HfO_2/Al_2O_3$, 1.16 nm of $SiO_2$, 71.98 nm of $HfO_2/Al_2O_3$, 23.02 nm of $SiO_2$, 42.36 nm of $HfO_2/Al_2O_3$ and 49.67 nm of $SiO_2$. The relative molar proportions of $HfO_2$ to $Al_2O_3$ for FIG. 9F are 50% $HfO_2$ and 50% $Al_2O_3$.

Figure 9G:
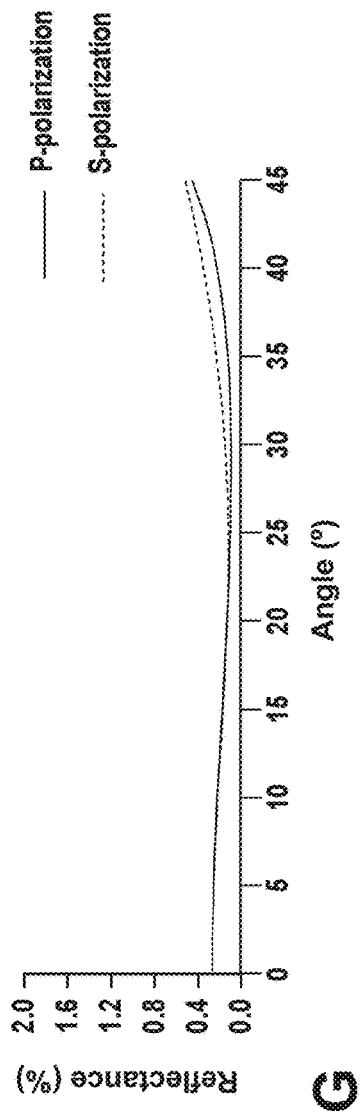

Referring now to FIG. 9G, depicted is the S-polarization and P-polarization reflection of a six-layer antireflection coating positioned on an $SiO_2$ 2 mm radius of curvature hemispherical lens at 266 nm according to a tenth example (i.e., Example 10). The antireflection coating of FIG. 9G has a layered structure, from the lens outward given in thicknesses, of 5.67 nm of $HfO_2$, 1.73 nm of $SiO_2$, 68.66 nm of $HfO_2/Al_2O_3$, 21.28 nm of $SiO_2$, 42.44 nm of $HfO_2/Al_2O_3$ and 49.44 nm of $SiO_2$. The relative molar proportions of $HfO_2$ to $Al_2O_3$ for FIG. 9G are 40% $HfO_2$ and 60% $Al_2O_3$.

Table 1 provides the averaged reflectance of the examples of FIGS. 9A-9F at 266 nm. As can be seen from FIGS. 9A-9G and table 1, use of the laminated layers of $HfO_2$ and $Al_2O_3$ enables control of reflected polarization split with a reduced average reflection in addition to surface roughness reduction.

TABLE 1

| Example | Averaged Reflectance (%) |
| --- | --- |
| Example 4 | 0.25 |
| Example 5 | 0.21 |
| Example 6 | 0.221 |
| Example 7 | 0.19 |
| Example 8 | 0.20 |
| Example 9 | 0.19 |

Clause 1 of the description discloses:
An optical element, comprising:
an optically transparent lens defining a curved surface comprising a steepness given by an R/# of from about 0.5 to about 1.0; and
a film positioned on the curved surface, the film comprising:
an index layer; and
a composite layer positioned on the curved surface having a refractive index greater than the index layer, the composite layer comprising $HfO_2$ and $Al_2O_3$, wherein the composite layer comprises a mole fraction X of $HfO_2$, wherein X is from about 0.05 to about 0.95 and a mole fraction of $Al_2O_3$ in the composite layer is 1−X.

Clause 2 of the description discloses:
The optical element of clause 1, wherein the mole fraction X of $HfO_2$ is from about 0.55 to about 0.65.

Clause 3 of the description discloses:
The optical element of clause 1 or 2, wherein the $HfO_2$ is segregated into a first plurality of layers and the $Al_2O_3$ is segregated into a second plurality of layers, and wherein the first plurality of layers alternate with the second plurality of layers.

Clause 4 of the description discloses:
The optical element of clause 3, wherein each layer of the first plurality of layers is amorphous and each layer of the second plurality of layers is amorphous.

Clause 5 of the description discloses:
The optical element of clause 3 or 4, wherein the composite layer has a thickness, the thickness comprising about 60% of the first plurality of layers and about 40% of the second plurality of layers.

Clause 6 of the description discloses:
The optical element of any of clauses 1-5, wherein the index layer comprises $SiO_2$.

Clause 7 of the description discloses:
The optical element of any of clauses 1-6, wherein the composite layer has a thickness of from about 30 nm to about 80 nm.

Clause 8 of the description discloses:
The optical element of clause 7, wherein the composite layer has a thickness of from about 40 nm to about 70 nm.

Clause 9 of the description discloses:
The optical element of any of clauses 1-8, wherein the index layer has a thickness of from about 1 nm to about 60 nm.

Clause 10 of the description discloses:
The optical element of clause 9, wherein the index layer has a thickness of from about 1 nm to about 30 nm.

Clause 11 of the description discloses:
The optical element of any of clauses 1-10, wherein the optical element exhibits a variance in reflectance between S-polarization and P-polarization of from about 0% to about 0.4% over an angle of incidence of from about 0° to about 45° at 266 nm as measured by spectroscopic ellipsometry.

Clause 12 of the description discloses:
The optical element of clause 11, wherein the optical element exhibits a variance in reflectance between S-polarization and P-polarization of from about 0% to about 0.2% over an angle of incidence from about 0° to about 45° at 266 nm as measured by spectroscopic ellipsometry.

Clause 13 of the description discloses:
The optical element of any of clauses 1-12, wherein the composite layer is amorphous.

Clause 14 of the description discloses:
An optical element, comprising:
 a lens defining a curved surface; and
 a film positioned on the curved surface, the film comprising:
a laminate layer positioned on the curved surface, the laminate layer comprising a plurality of first layers comprising $HfO_2$ and a plurality of second layers comprising $Al_2O_3$; and
an index layer comprising $SiO_2$, wherein the film has a variation in reflectance of from about 0% to about 4% over a wavelength band of from about 220 nm to about 500 nm as measured across the lens and between about a 0 clear aperture value and a 0.96 clear aperture value as measured by reflective spectral microscopy.

Clause 15 of the description discloses:
The optical element of clause 14, wherein the film has a variation in reflectance of from about 0% to about 2% over a wavelength band of from about 220 nm to about 500 nm as measured across the lens and between about a 0 clear aperture value and a 0.96 clear aperture value as measured by reflective spectral microscopy.

Clause 16 of the description discloses:
The optical element of clause 14 or 15, wherein the plurality of first layers have a refractive index of about 2.3 at 266 nm.

Clause 17 of the description discloses:
The optical element of any of clauses 14-16, wherein the plurality of second layers have a refractive index of about 1.7 at 266 nm.

Clause 18 of the description discloses:
The optical element of any of clauses 14-17, wherein the plurality of first and second layers of the laminate layer are stacked in an alternating order.

Clause 19 of the description discloses:
The optical element of any of clauses 14-18, wherein the first plurality of layers comprise about 60% of the thickness of the laminate layer and the plurality of second layers comprise about 40% of the thickness of the laminate layer.

Clause 20 of the description discloses:
The optical element of any of clauses 14-19, wherein the laminate layer is amorphous.

Clause 21 of the description discloses:
A method of forming a film of an optical element, comprising the step of:
 positioning a substantially transparent lens in a reactor chamber, wherein the lens defines a curved surface;
 exposing the lens to a first precursor comprising at least one of Al and Hf such that the first precursor is deposited on the curved surface of the lens;
 exposing the first precursor on the curved surface to a first oxidizer such that the first precursor present on the curved surface of the lens reacts with the first oxidizer to form a high refractive index layer of the film;
 exposing the high refractive index layer to a second precursor such that the second precursor is deposited on the high refractive index layer; and
 exposing the second precursor on the high refractive index layer to a second oxidizer such that the second precursor present on the high refractive index layer reacts with the second oxidizer to form a low refractive index layer of the film.

Clause 22 of the description discloses:
The method of clause 21, further comprising the step of:
 heating the substantially transparent lens to a temperature of from about 50° C. to about 350° C.

Clause 23 of the description discloses:
The method of clause 21 or 22, wherein the step of exposing the first precursor on the curved surface to a first oxidizer further comprises the step:
 exposing the first precursor on the curved surface to water vapor.

Clause 24 of the description discloses:
The method of any of clauses 21-23, wherein the step of positioning the substantially transparent lens in the reactor chamber further comprises positioning the substantially transparent lens in the reactor chamber comprising a Steepness given by an R/# of from about 0.5 to about 1.0.

Clause 25 of the description discloses:
The method of any of clauses 21-24, wherein the first precursor comprises Hf and a halide.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise. Further, the claims, as set forth below,

What is claimed is:

1. An optical element, comprising:
a lens defining a curved surface comprising a steepness given by an R/# of about 0.5 or greater, wherein the R/# value is calculated as a radius of curvature divided by a clear aperture of the lens; and
a film positioned on the curved surface, the film comprising:
a laminate layer positioned on the curved surface, the laminate layer comprising a plurality of first layers comprising $HfO_2$ each having a first layer thickness in a range from 1 nm to 10 nm and a plurality of second layers comprising $Al_2O_3$ each having a second layer thickness in a range from 1 nm to 10 nm, wherein the laminate layer comprises a mole fraction X of $HfO_2$, wherein X is from 0.70 to 0.90 and a mole fraction of $Al_2O_3$ in the laminate layer is 1−X, further wherein a quarter-wave thickness at a wavelength of 266 nm of $HfO_2$ is greater than the first layer thickness and a quarter-wave thickness at a wavelength of 266 nm of $Al_2O_3$ is greater than the second layer thickness; and
an index layer comprising $SiO_2$, wherein the film has a variation in reflectance of from about 0% to about 4% over a wavelength band of from about 220 nm to about 500 nm as measured across the lens and between about a 0 clear aperture value and a 0.96 clear aperture value of the lens as measured by reflective spectral microscopy.

2. The optical element of claim 1, wherein the film has a variation in reflectance of from about 0% to about 2% over a wavelength band of from about 220 nm to about 500 nm as measured across the lens and between about a 0 clear aperture value and a 0.96 clear aperture value of the lens as measured by reflective spectral microscopy.

3. The optical element of claim 1, wherein the plurality of first layers have a refractive index of about 2.3 at a wavelength of 266 nm.

4. The optical element of claim 1, wherein the plurality of second layers have a refractive index of about 1.7 at a wavelength of 266 nm.

5. The optical element of claim 1, wherein the plurality of first and second layers of the laminate layer are stacked in an alternating order.

6. The optical element of claim 1, wherein the first plurality of layers comprise about 60% of the thickness of the laminate layer and the plurality of second layers comprise about 40% of the thickness of the laminate layer.

7. The optical element of claim 1, wherein the laminate layer is amorphous.

8. The optical element of claim 1, wherein the optical element exhibits a variance in reflectance between S-polarization and P-polarization of from about 0% to about 0.4% over an angle of incidence of from about 0° to about 45° to a central axis of the curved surface at a wavelength of 266 nm as measured by spectroscopic ellipsometry.

9. An optical element, comprising:
a lens defining a curved surface comprising a steepness given by an R/# of about 0.5 or greater, wherein the R/# value is calculated as a radius of curvature divided by a clear aperture of the lens; and
a film having a thickness in a range from about 0.005 µm to about 20 µm and positioned on the curved surface, the film comprising:
a laminate layer positioned on the curved surface, the laminate layer comprising a plurality of first layers comprising $HfO_2$ and a plurality of second layers comprising $Al_2O_3$, wherein the laminate layer comprises a mole fraction X of $HfO_2$, wherein X is from 0.70 to 0.90 and a mole fraction of $Al_2O_3$ in the laminate layer is 1−X, further wherein a layer of thickness of each of the plurality of first layers and the plurality of second layers is less than a quarter-wave thickness at a wavelength of 266 nm of each of $HfO_2$ and $Al_2O_3$ in the laminate layer, respectively; and
an index layer comprising $SiO_2$, wherein the film has a variation in reflectance of from about 0% to about 4% over a wavelength band of from about 220 nm to about 500 nm as measured across the lens and between about a 0 clear aperture value and a 0.96 clear aperture value of the lens as measured by reflective spectral microscopy.

10. The optical element of claim 9, wherein the film has a variation in reflectance of from about 0% to about 2% over a wavelength band of from about 220 nm to about 500 nm as measured across the lens and between about a 0 clear aperture value and a 0.96 clear aperture value of the lens as measured by reflective spectral microscopy.

11. The optical element of claim 9, wherein the quarter-wave thickness of $HfO_2$ is about 29.7 nm at a wavelength of 266 nm.

12. The optical element of claim 9, wherein the quarter-wave thickness of $Al_2O_3$ is about 38.4 nm at a wavelength of 266 nm.

13. The optical element of claim 9, wherein the plurality of first and second layers of the laminate layer are stacked in an alternating order.

14. The optical element of claim 9, wherein the first plurality of layers comprise about 60% of the thickness of the laminate layer and the plurality of second layers comprise about 40% of the thickness of the laminate layer.

15. The optical element of claim 9, wherein the laminate layer is optically homogenous.

16. The optical element of claim 9, wherein the optical element exhibits a variance in reflectance between S-polarization and P-polarization of from about 0% to about 0.4% over an angle of incidence of from about 0° to about 45° to a central axis of the curved surface at a wavelength of 266 nm as measured by spectroscopic ellipsometry.

* * * * *